US009887328B2

(12) United States Patent
Tomizawa et al.

(10) Patent No.: US 9,887,328 B2
(45) Date of Patent: Feb. 6, 2018

(54) SEMICONDUCTOR LIGHT EMITTING DEVICE AND METHOD FOR MANUFACTURING SAME

(71) Applicant: Kabushiki Kaisha Toshiba, Minato-ku (JP)

(72) Inventors: Hideyuki Tomizawa, Kanazawa (JP); Akihiro Kojima, Nonoichi (JP); Miyoko Shimada, Hakusan (JP); Yosuke Akimoto, Nonoichi (JP); Hideko Mukaida, Kunitachi (JP); Mitsuyoshi Endo, Yamato (JP); Hideto Furuyama, Yokohama (JP); Yoshiaki Sugizaki, Fujisawa (JP); Kazuo Fujimura, Kanazawa (JP); Shinya Ito, Kanazawa (JP); Shinji Nunotani, Kanazawa (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 91 days.

(21) Appl. No.: 14/328,048

(22) Filed: Jul. 10, 2014

(65) Prior Publication Data
US 2015/0069437 A1    Mar. 12, 2015

(30) Foreign Application Priority Data

Sep. 11, 2013   (JP) .................................. 2013-188558
Mar. 26, 2014   (JP) .................................. 2014-064515

(51) Int. Cl.
*H01L 29/06*     (2006.01)
*H01L 33/54*     (2010.01)
(Continued)

(52) U.S. Cl.
CPC .......... *H01L 33/54* (2013.01); *H01L 33/0079* (2013.01); *H01L 33/46* (2013.01);
(Continued)

(58) Field of Classification Search
None
See application file for complete search history.

(56) References Cited

U.S. PATENT DOCUMENTS 5,119,171 A      6/1992   Lesk et al.
8,692,279 B2 *   4/2014   Izuka .................. H01L 33/38
                                              257/91
(Continued)

FOREIGN PATENT DOCUMENTS

EP   2 302 708 A2   3/2011
EP   2 302 708 A3   3/2011
(Continued)

OTHER PUBLICATIONS

Office Action dated Jul. 17, 2015 in Korean Patent Application No. 10-2014-0089032 (with English translation).
(Continued)

*Primary Examiner* — David E Graybill
(74) *Attorney, Agent, or Firm* — Oblon, McClelland, Maier & Neustadt, L.L.P.

(57) ABSTRACT

According to one embodiment, a semiconductor light emitting device includes a semiconductor layer, a sealing member configured to cover a lower surface of the semiconductor layer and a side surface of the semiconductor layer to protrude to be higher than an upper surface of the semiconductor layer at a side of the semiconductor layer, a fluorescer layer provided above the semiconductor layer and the sealing member, and an insulating film provided between the sealing member and the semiconductor layer and between the sealing member and the fluorescer layer. A corner of a protruding portion of the sealing member is rounded.

4 Claims, 22 Drawing Sheets

(51) Int. Cl.
  *H01L 33/00* (2010.01)
  *H01L 33/46* (2010.01)
  *H01L 33/50* (2010.01)
  *H01L 33/60* (2010.01)

(52) U.S. Cl.
  CPC ............ *H01L 33/505* (2013.01); *H01L 33/60* (2013.01); *H01L 2933/005* (2013.01); *H01L 2933/0025* (2013.01)

(56) References Cited

U.S. PATENT DOCUMENTS

| | | | |
|---|---|---|---|
| 8,742,440 B2 * | 6/2014 | Fudeta | H01L 33/12 257/94 |
| 9,171,882 B2 * | 10/2015 | Akimoto | H01L 27/156 |
| 9,209,224 B2 * | 12/2015 | Kawai | H01L 33/08 |
| 2011/0297997 A1 * | 12/2011 | Izuka | H01L 33/38 257/99 |
| 2012/0097972 A1 | 4/2012 | Sugizaki et al. | |
| 2012/0153330 A1 | 6/2012 | Tsutsui | |
| 2012/0319080 A1 * | 12/2012 | Fudeta | H01L 33/12 257/13 |
| 2014/0175471 A1 * | 6/2014 | Akimoto | H01L 27/156 257/91 |
| 2015/0069437 A1 * | 3/2015 | Tomizawa | H01L 33/54 257/98 |
| 2015/0270448 A1 * | 9/2015 | Chyu | H01L 33/46 257/98 |
| 2015/0295136 A1 | 10/2015 | Sugizaki et al. | |

FOREIGN PATENT DOCUMENTS

| | | |
|---|---|---|
| EP | 2 393 132 A2 | 12/2011 |
| EP | 2 393 132 A3 | 12/2011 |
| EP | 2 546 894 A2 | 1/2013 |
| JP | 2000-243942 | 9/2000 |
| JP | 2004-80050 A | 3/2004 |
| JP | 2004-087598 | 3/2004 |
| JP | 2004-349461 | 12/2004 |
| JP | 2005-39122 | 2/2005 |
| JP | 2006-165121 | 6/2006 |
| JP | 2011-71272 A | 4/2011 |
| JP | 2011-71444 A | 4/2011 |
| JP | 2011-155295 | 8/2011 |
| JP | 2013-42191 | 2/2013 |
| KR | 10-2012-0066973 | 6/2012 |
| TW | 201318230 A1 | 5/2013 |
| WO | WO2012123998 * | 9/2012 |
| WO | WO 2013/021519 A1 | 2/2013 |
| WO | WO 2013/097046 A1 | 7/2013 |
| WO | WO2013097046 * | 7/2013 |

OTHER PUBLICATIONS

Office Action dated Sep. 22, 2015 in Taiwanese Patent Application No. 103122269 (with English language translation).
Office Action dated Jan. 26, 2016 in Korean Patent Application No. 10-2014-0089032 (with English language translation).
Extended European Search Report dated May 15, 2015 in Application No. 14177043.8.
Partial European Search Report dated Feb. 6, 2015 in Patent Application No. 14177043.8.

* cited by examiner

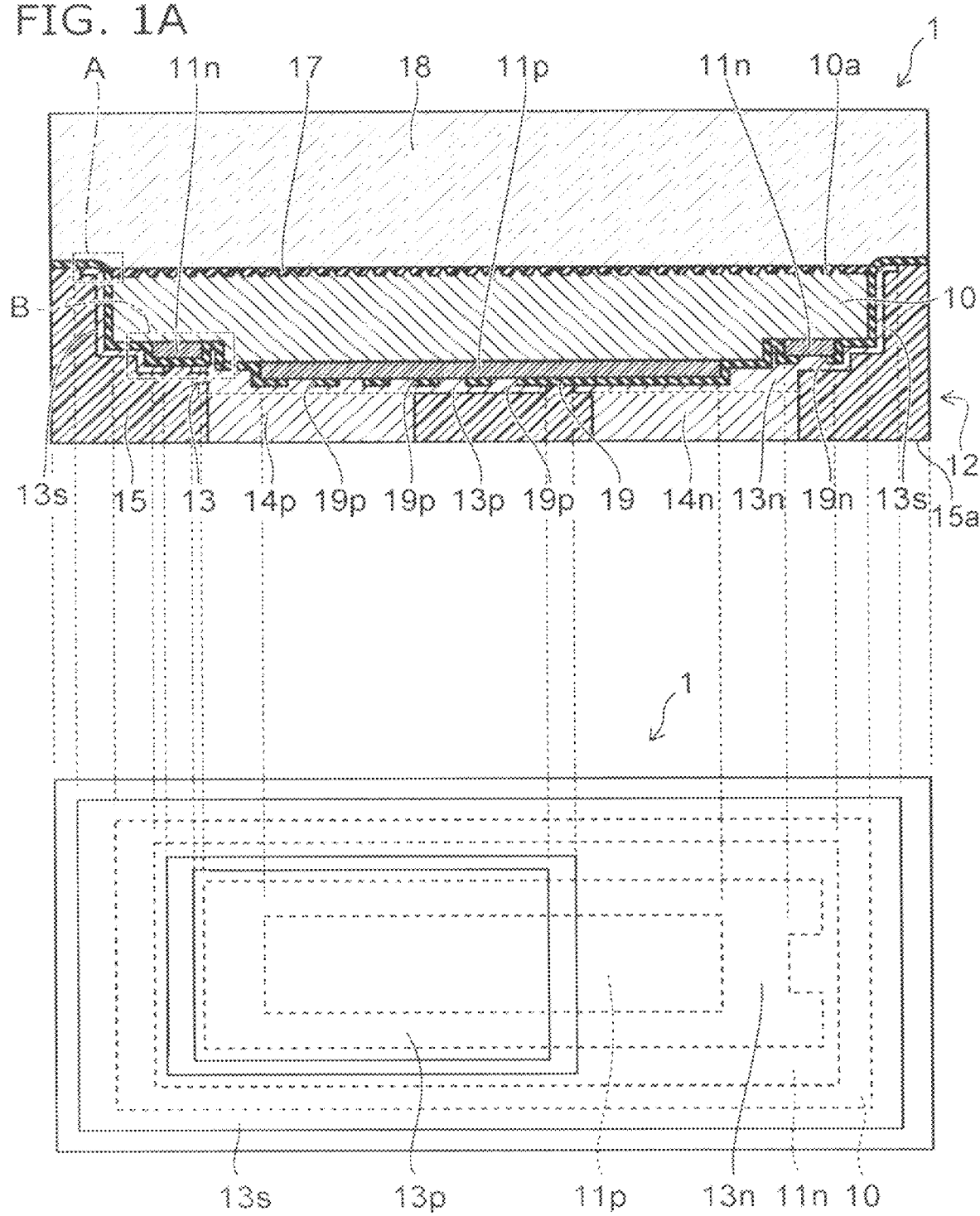

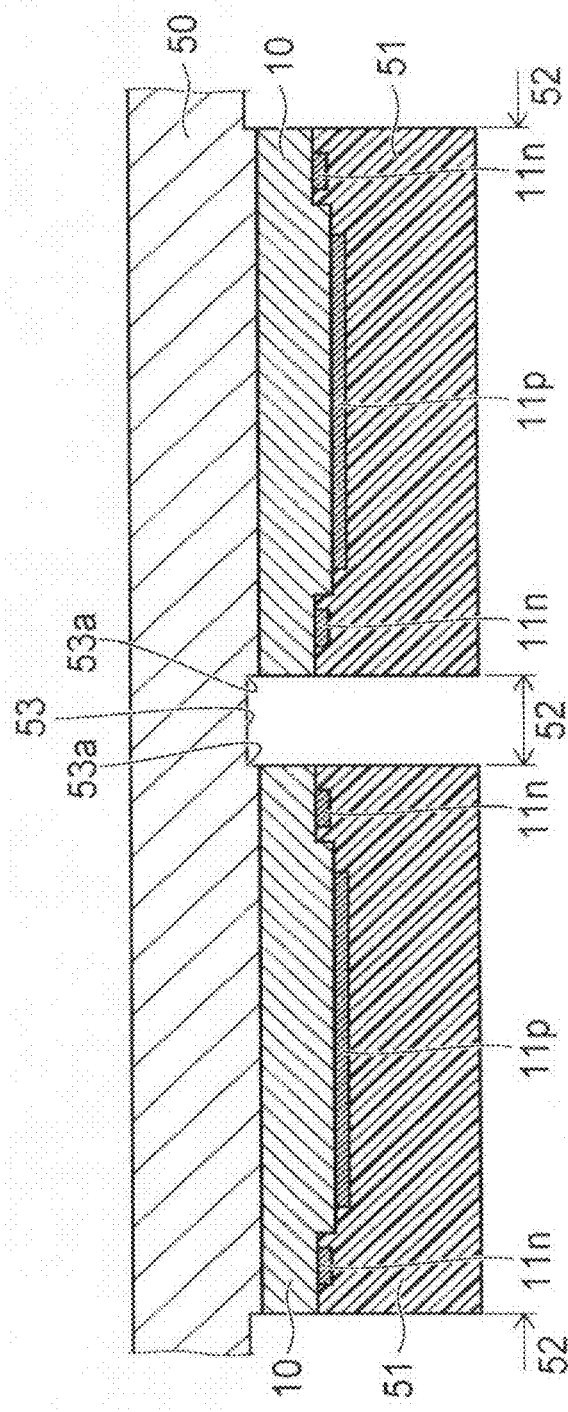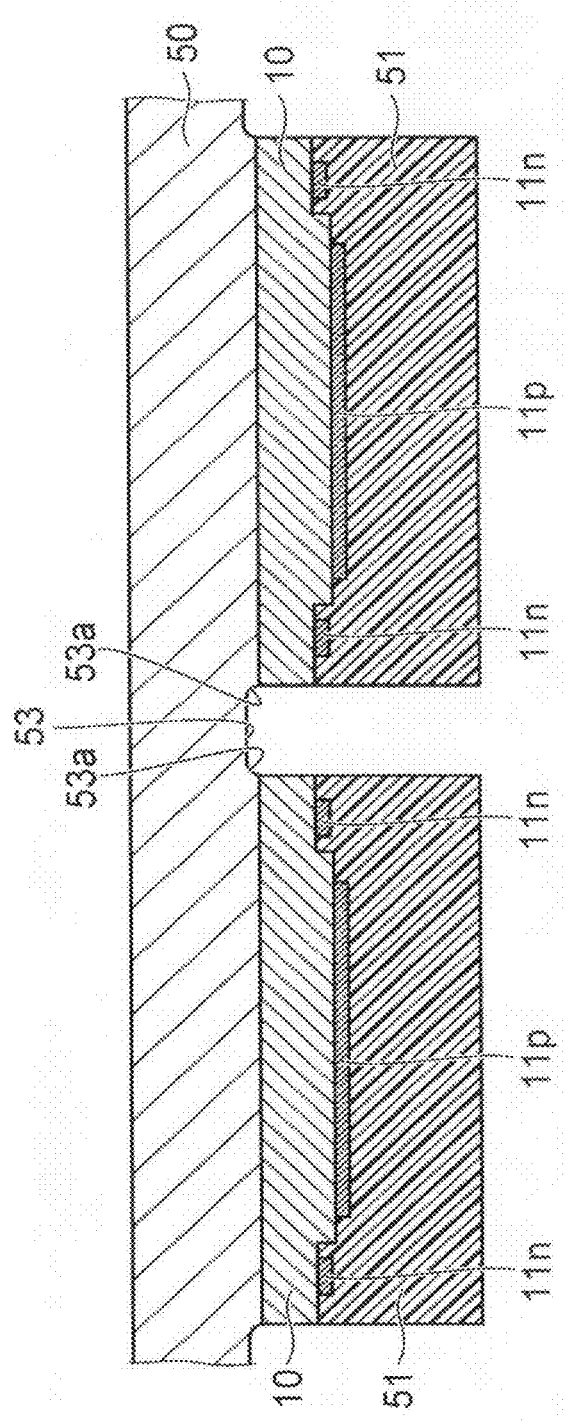

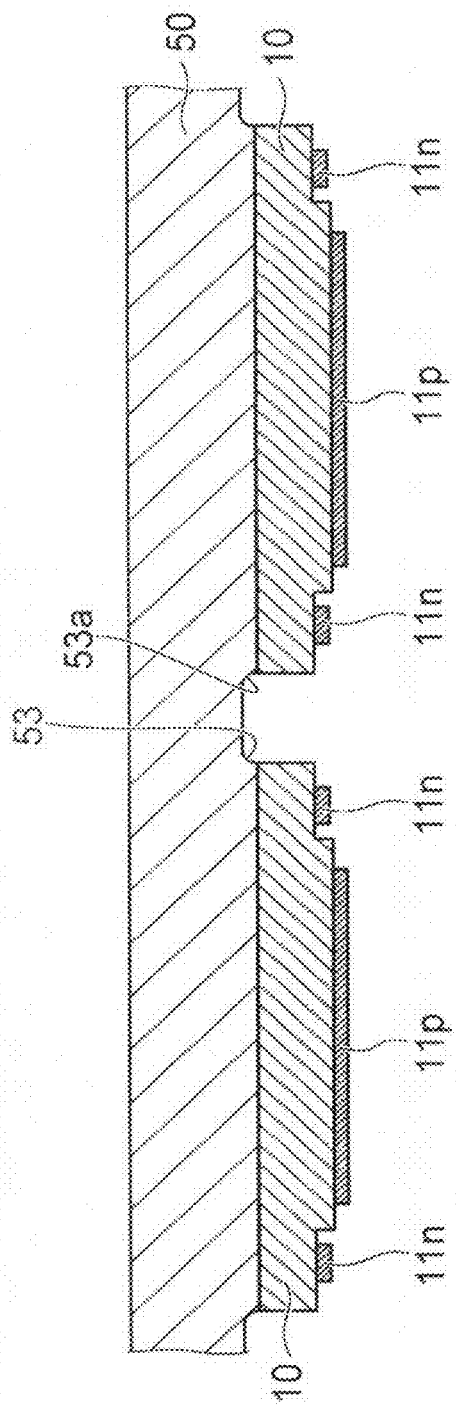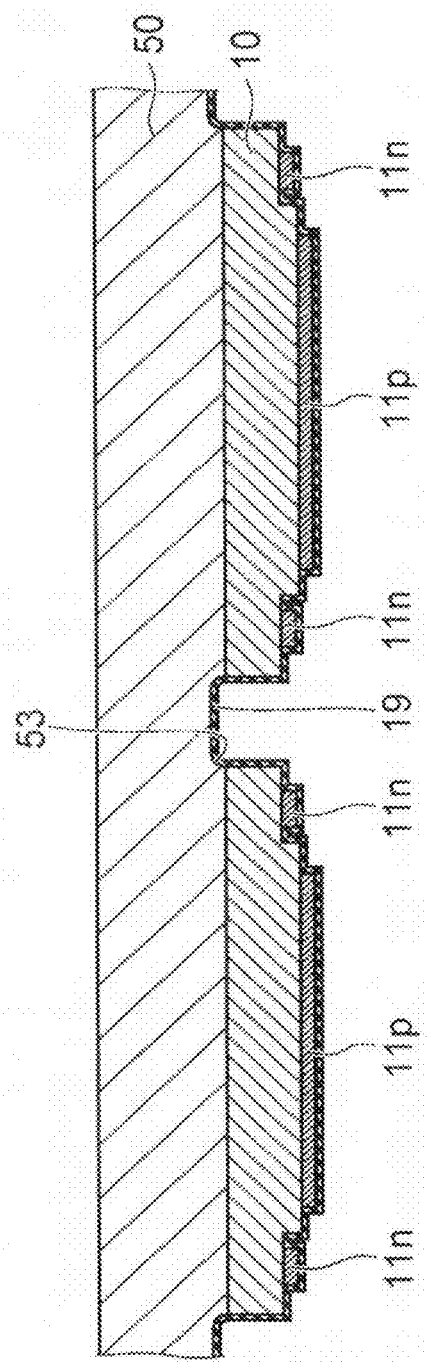

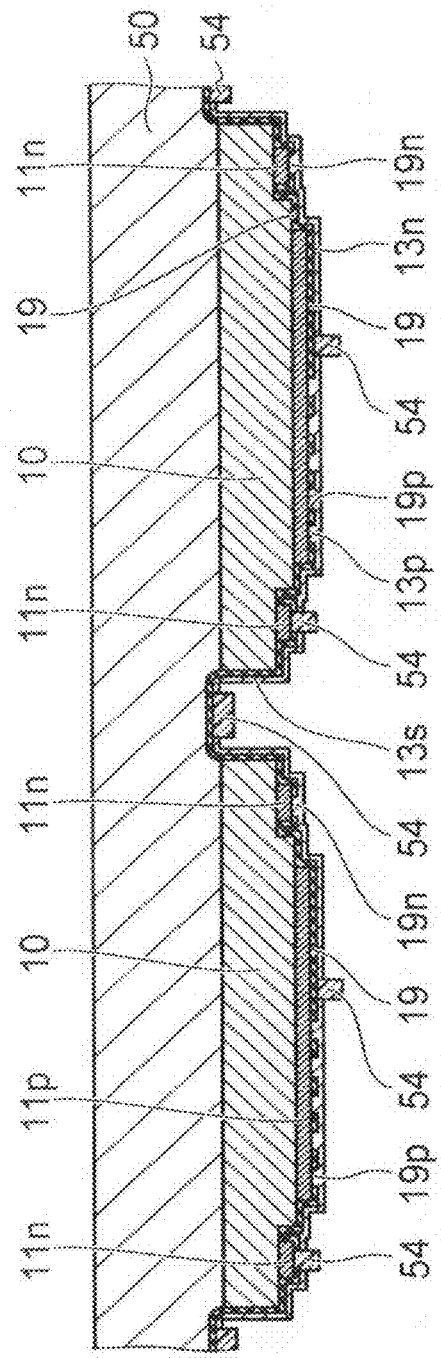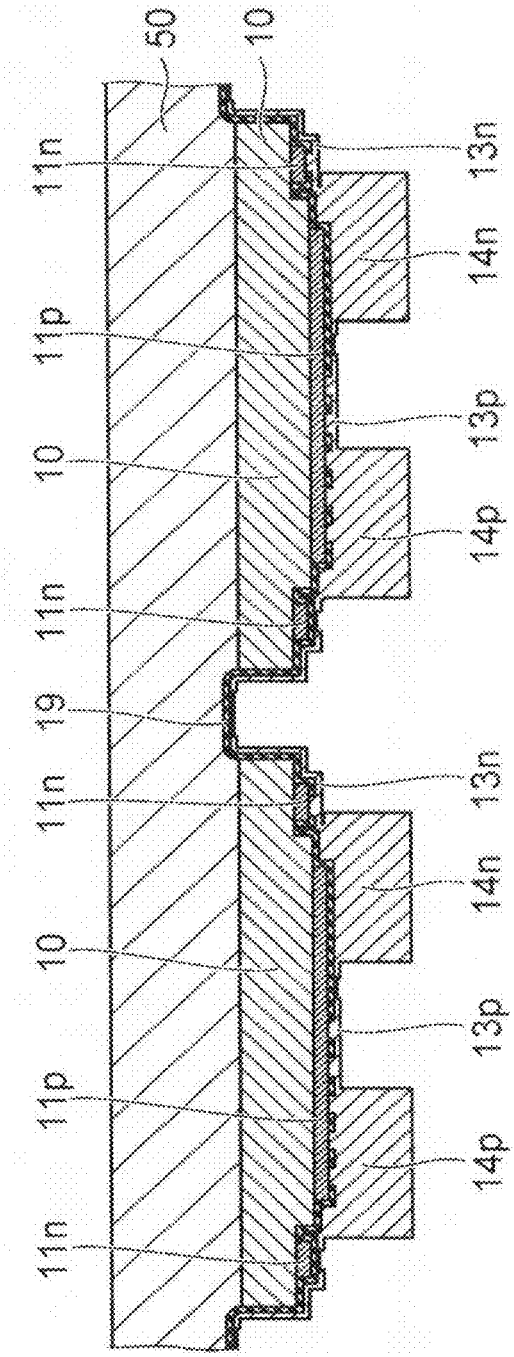
FIG. 7A
FIG. 7B

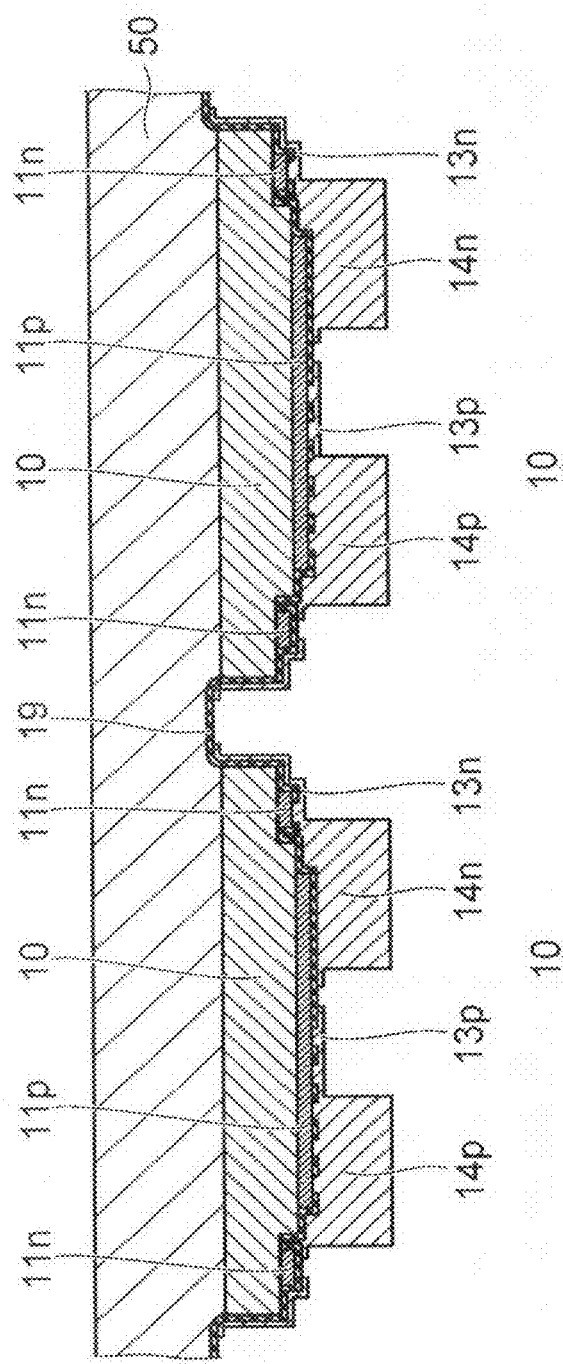
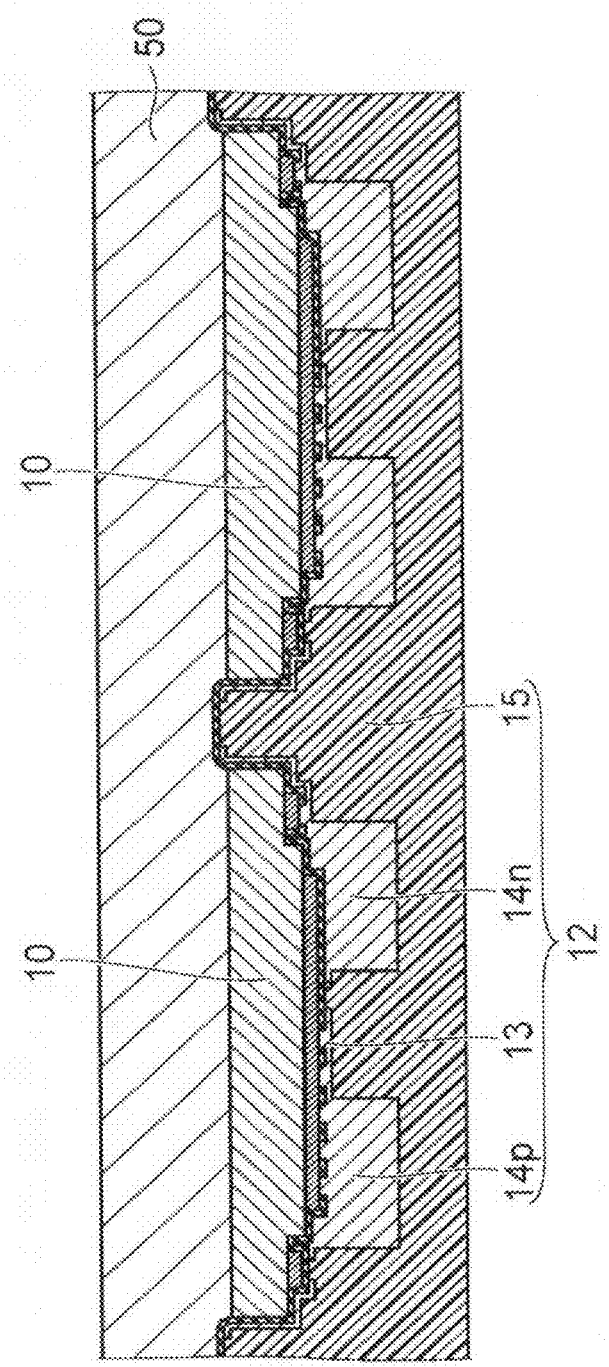

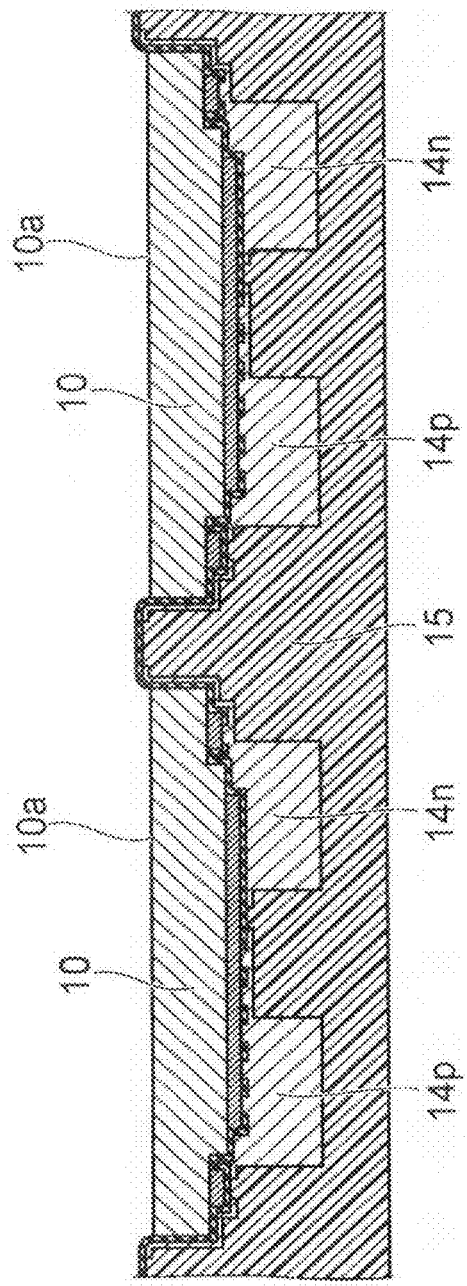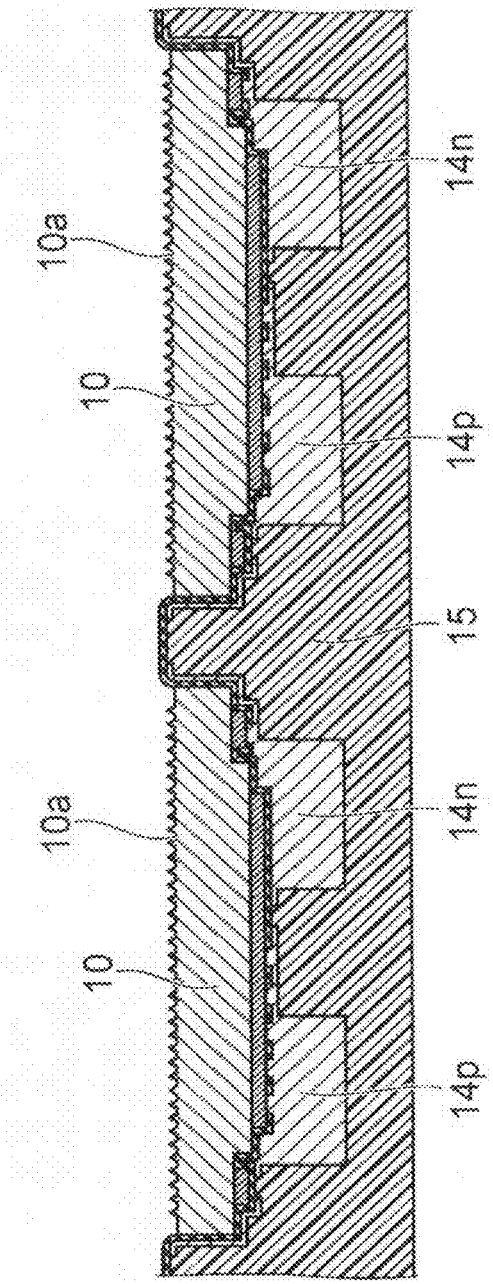

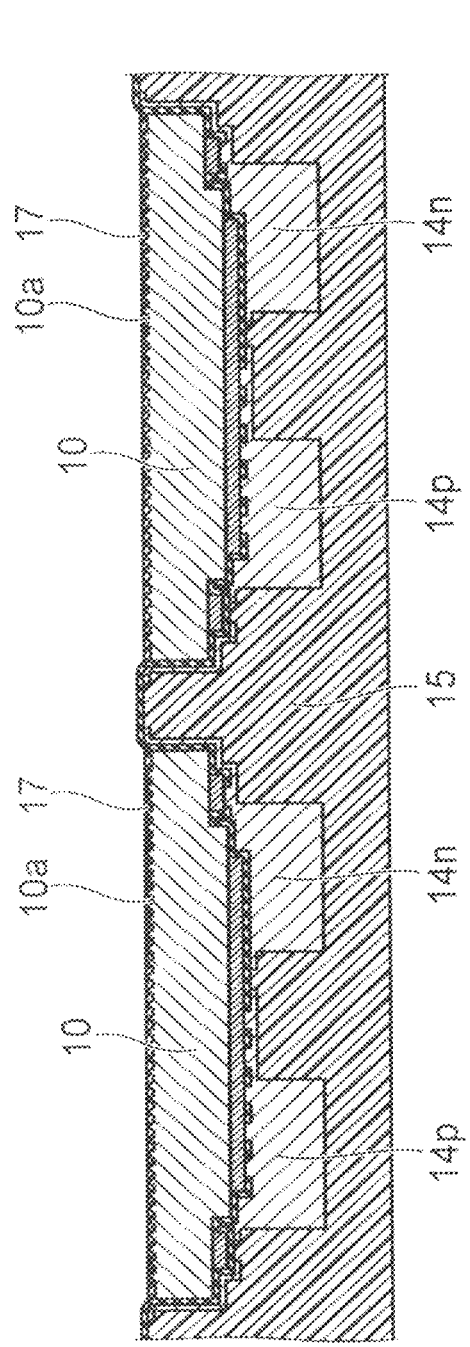
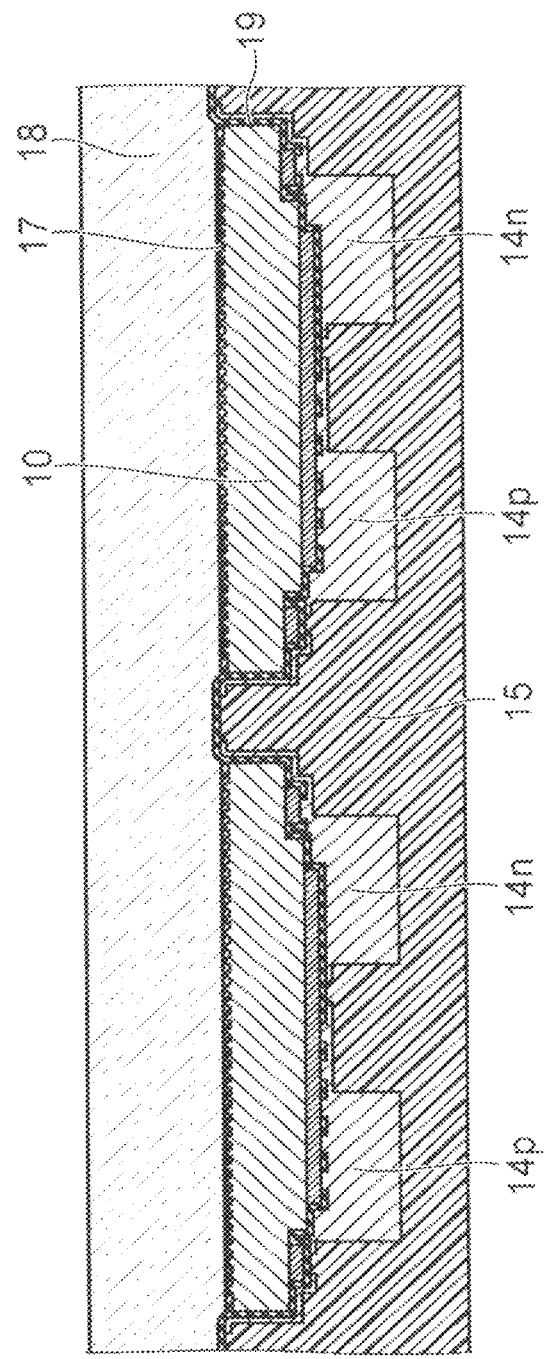
FIG. 10A
FIG. 10B

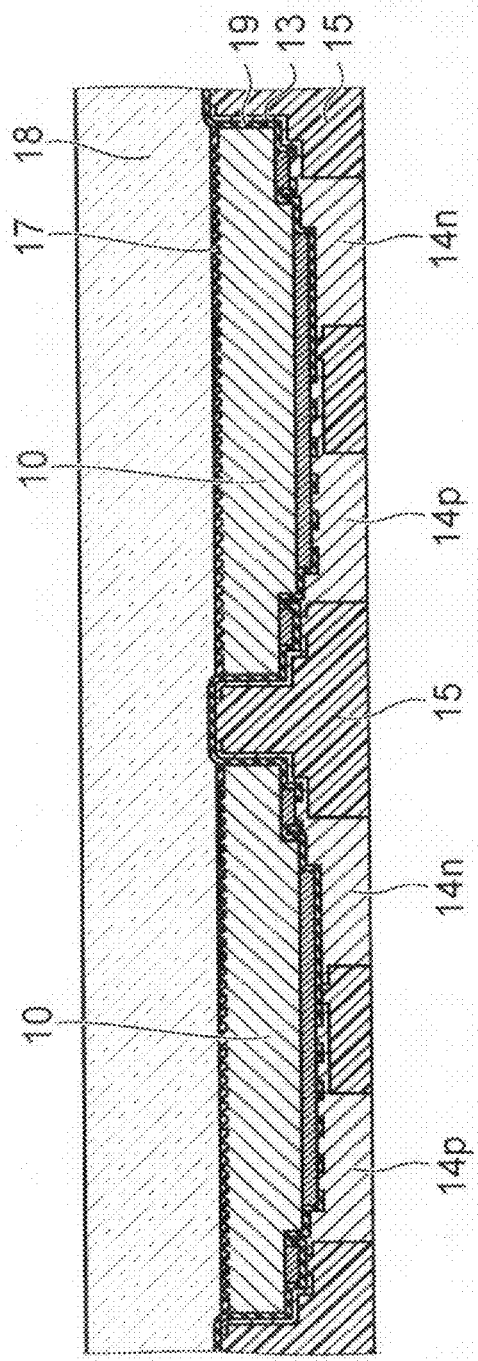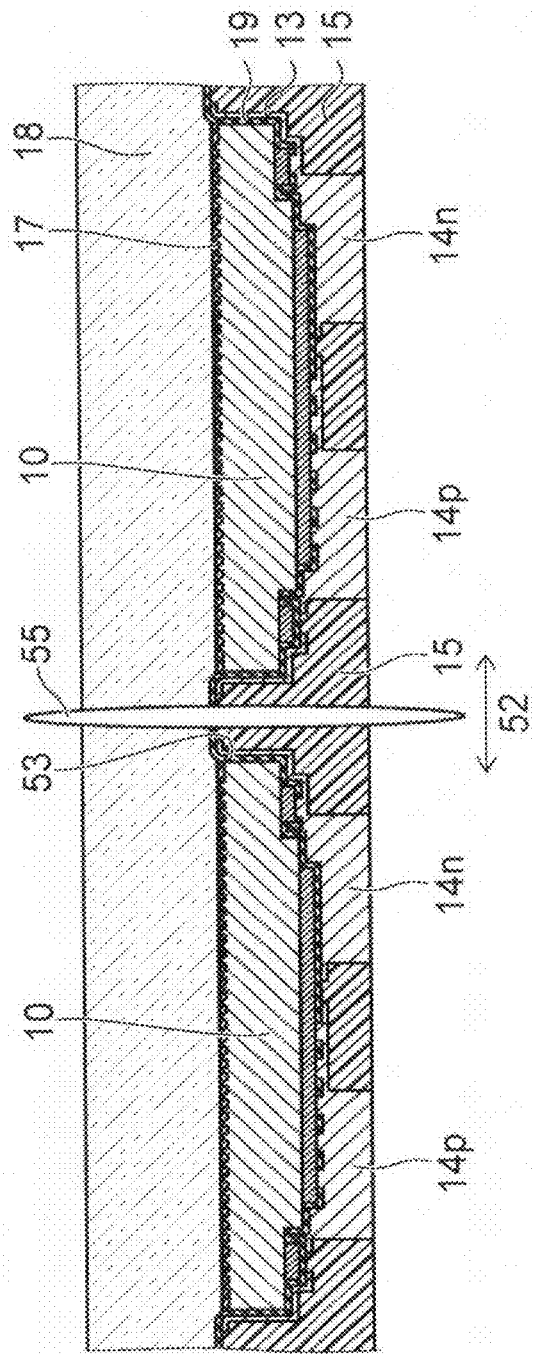

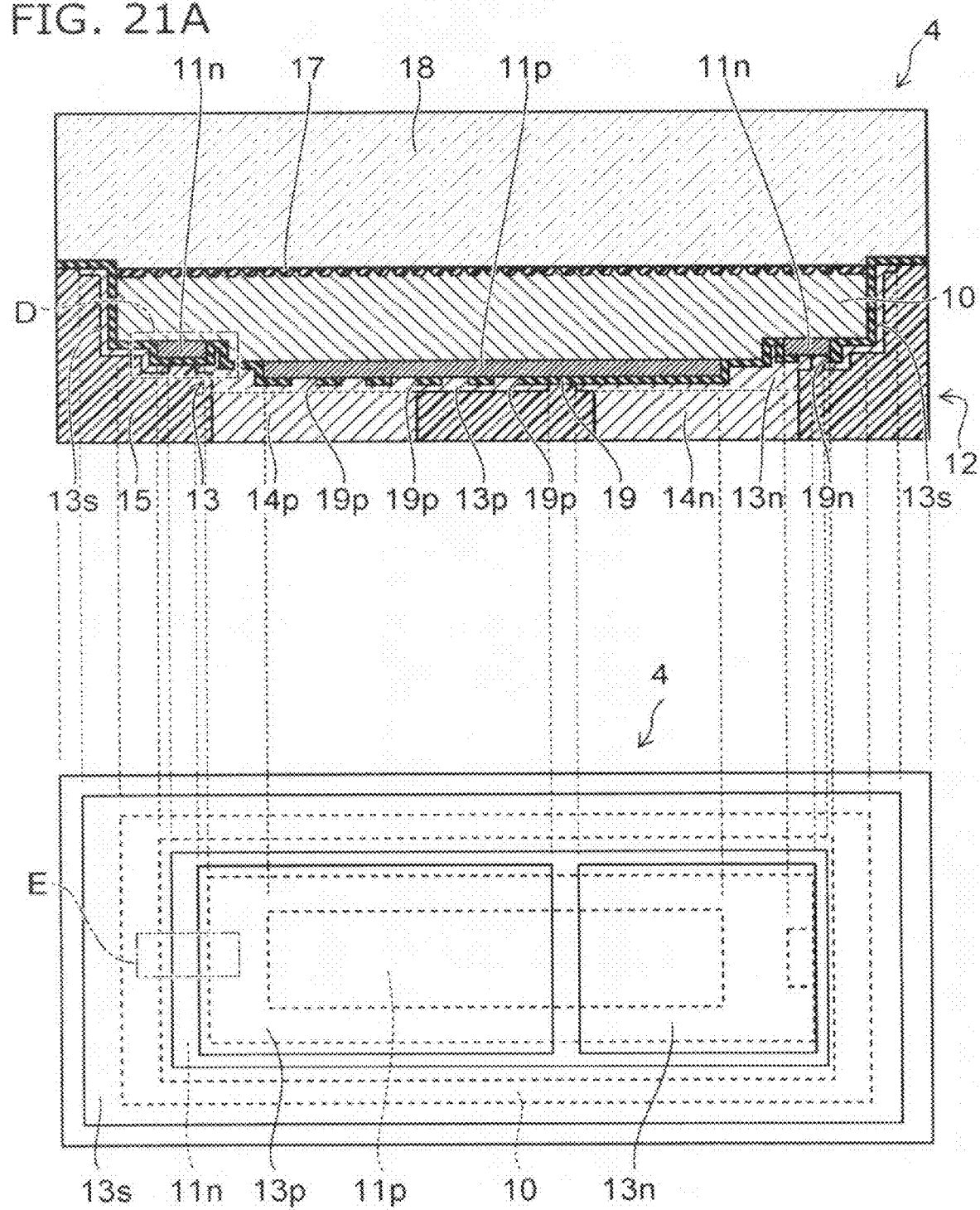

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from Japanese Patent Application No. 2013-188558, filed on Sep. 11, 2013 and Japanese Patent Application No. 2014-064515, filed on Mar. 26, 2014; the entire contents of which are incorporated herein by reference.

FIELD

Embodiments described herein relate generally to a semiconductor light emitting device and a method for manufacturing the same.

BACKGROUND

Conventionally, a method for manufacturing a semiconductor light emitting device has been proposed in which a semiconductor layer is grown by crystal growth on a wafer; electrodes are formed on the semiconductor layer; sealing with a resin body is performed; subsequently, the wafer is removed; a fluorescer layer is formed on the exposed surface of the semiconductor layer; and dicing is performed. According to such a method, fine structural bodies that are formed on the wafer can be packaged as-is; and fine semiconductor light emitting devices can be efficiently manufactured.

BRIEF DESCRIPTION OF THE DRAWINGS

FIG. 1A is a cross-sectional view showing a semiconductor light emitting device according to a first embodiment; and FIG. 1B is a bottom view of FIG. 1A;

FIGS. 3A and 3B to FIGS. 11A and 11B are cross-sectional views of processes, showing the method for manufacturing the semiconductor light emitting device according to the first embodiment;

FIG. 21A is a cross-sectional view showing a semiconductor light emitting device according to a fourth embodiment; and FIG. 21B is a bottom view of FIG. 21A.

DETAILED DESCRIPTION

A semiconductor light emitting device according to an embodiment includes a semiconductor layer, a sealing member configured to cover a lower surface of the semiconductor layer and a side surface of the semiconductor layer to protrude to be higher than an upper surface of the semiconductor layer at a side of the semiconductor layer, a fluorescer layer provided above the semiconductor layer and the sealing member, and an insulating film provided between the sealing member and the semiconductor layer and between the sealing member and the fluorescer layer. A corner of a protruding portion of the sealing member is rounded.

A semiconductor light emitting device according to an embodiment includes a semiconductor layer, an electrode connected to the semiconductor layer, a sealing member configured to cover a lower surface and a side surface of a structural body made of the semiconductor layer and the electrode, a fluorescer layer provided above the semiconductor layer and the sealing member, and an insulating film provided between the semiconductor layer and the sealing member and between the fluorescer layer and the sealing member. The sealing member includes the metal portion and the resin portion. An end portion of the metal portion extends onto an end portion of the electrode with the insulating film interposed.

A method for manufacturing a semiconductor light emitting device according to an embodiment includes growing a semiconductor layer on a substrate. The method includes dividing the semiconductor layer into a plurality of portions by selectively removing the semiconductor layer, and making a trench in a region of the substrate corresponding to a space between the plurality of portions. The method includes rounding a corner of the trench. The method includes forming an insulating film to cover the substrate, the semiconductor layer, and the corner. The method includes forming a sealing member on the insulating film. The method includes removing the substrate. And, the method includes forming a fluorescer layer to cover a surface that was opposing the substrate, the surface being formed of the semiconductor layer and the insulating film.

Embodiments of the invention will now be described with reference to the drawings.

First Embodiment

First, a first embodiment will be described.

FIG. 1A is a cross-sectional view showing a semiconductor light emitting device according to the embodiment; and FIG. 1B is a bottom view of FIG. 1A.

Figure 2A:
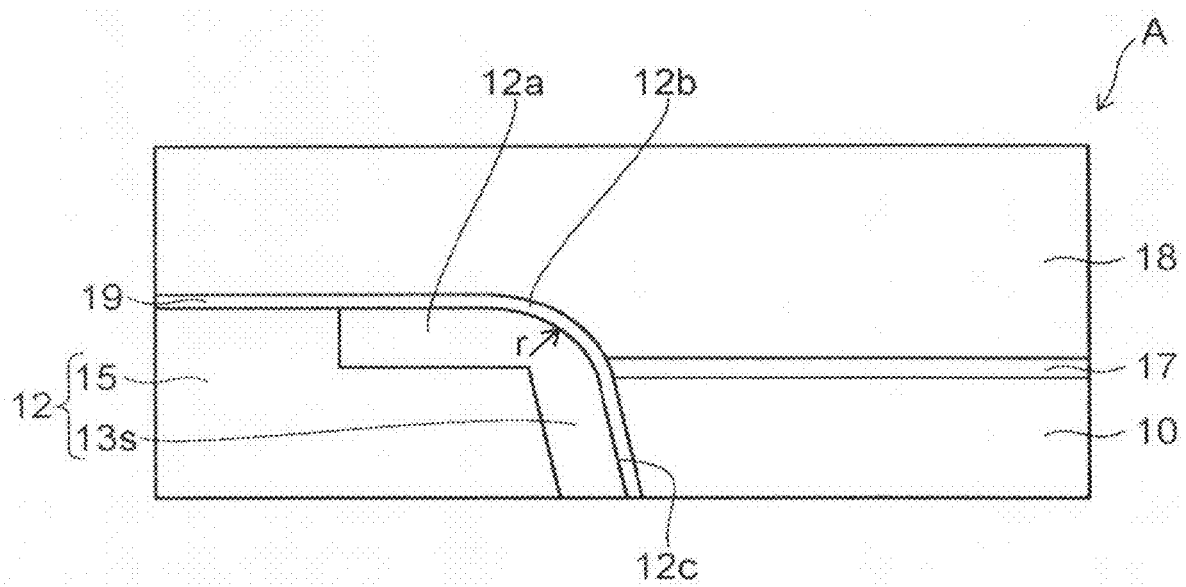
FIG. 2A is a partially-enlarged cross-sectional view showing region A of FIG. 1A.
Figure 2B:
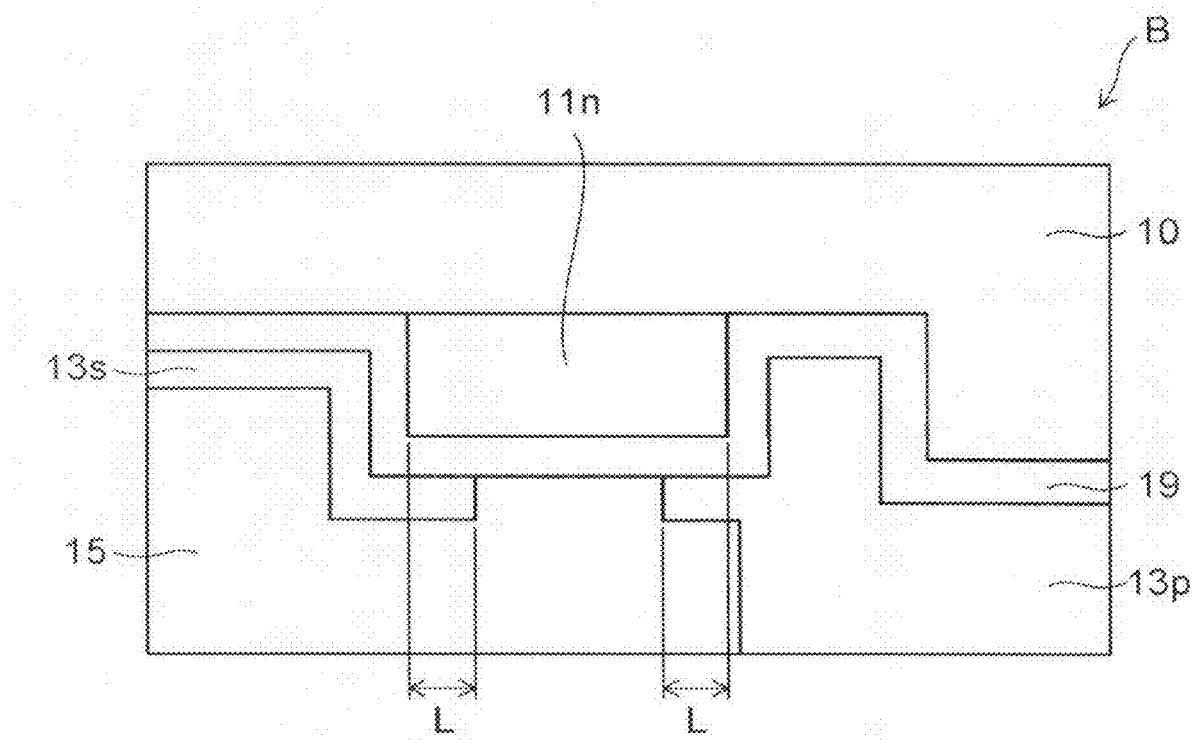
FIG. 2B is a bottom view of FIG. 2A.

FIG. 2A is a partially-enlarged cross-sectional view showing region A of FIG. 1A; and FIG. 2B is a partially-enlarged cross-sectional view showing region B.

In FIG. 2B, only a semiconductor layer 10, an n-side electrode 11n, a p-side electrode 11p, and an interconnect layer 13 are shown for easier viewing of the drawing. Further, the edge lines illustrating the configurations of these members are not shown.

As shown in FIGS. 1A and 1B, the configuration of the entire semiconductor light emitting device 1 according to the embodiment is a rectangular parallelepiped. A semiconductor layer 10 is provided in the semiconductor light emitting device 1. The semiconductor layer 10 is formed of a compound semiconductor including, for example, gallium nitride (GaN) and is an LED (Light Emitting Diode) layer in which a p-type clad layer, an active layer, and an n-type clad layer are stacked in order from the lower layer side. When viewed in the thickness direction, the configuration of the semiconductor layer 10 is a rectangle, e.g., a square; and at the four corners of the rectangle, the p-type clad layer and the active layer are removed and the n-type clad layer is exposed. Also, a fine unevenness that has a period that is about the same as the wavelength of the light emitted by the semiconductor layer 10 is formed in an upper surface 10a of the semiconductor layer 10. The n-type clad layer, the active layer, and the p-type clad layer are portions of the semiconductor layer 10 but are not discriminated in the illustration of FIGS. 1A and 1B. This is similar for other drawings described below.

An n-side electrode 11n and a p-side electrode 11p are provided on the lower surface of the semiconductor layer 10. The n-side electrode 11n is connected to the n-type clad layer of the semiconductor layer 10; and the p-side electrode 11p is connected to the p-type clad layer of the semiconductor layer 10. In the n-side electrode 11n, for example, an aluminum (Al) layer is provided on the semiconductor layer 10 side; and a gold (Au) layer is stacked on the aluminum layer. The p-side electrode 11p is formed of, for example, silver (Ag).

Although the n-side electrode 11n and the p-side electrode 11p are disposed on the lower side as viewed from the semiconductor layer 10 in the drawings, the vertical direction is independent of the direction of gravity. Further, although the notation of up and down in the description of the configuration of the semiconductor light emitting device 1 referring to FIGS. 1A and 1B and FIGS. 2A and 2B matches the drawings, the notation of up and down is modified appropriately in the description of the manufacturing methods described below for convenience of description.

A sealing member 12 is provided to cover the lower surface and the side surface of a structural body that is made of the semiconductor layer 10, the n-side electrode 11n, and the p-side electrode 11p. In the specification, "covering" is a concept including both the case where the covering object contacts the covered object and the case where the covering object does not contact the covered object. The sealing member 12 includes an interconnect layer 13, an n-side pillar 14n, a p-side pillar 14p, and a black resin portion 15. The interconnect layer 13, the n-side pillar 14n, and the p-side pillar 14p of the sealing member 12 are metal portions made of a conductive material, e.g., copper (Cu); and the black resin portion 15 is a resin portion made of an opaque resin, e.g., a black resin. The sealing member 12 protrudes to be higher than the upper surface 10a of the semiconductor layer 10 at the semiconductor layer 10 side.

An adhesion layer 17 that is made of, for example, silicon oxide (SiO) is provided on the upper surface 10a of the semiconductor layer 10. A fluorescer layer 18 is provided above the adhesion layer 17 and the sealing member 12. In the fluorescer layer 18, many fluorescer particles (such as 18b in FIG. 19B) are dispersed in a main material (such as 18a in FIG. 19B) made of a transparent resin. The fluorescer layer 18 is included in the upper portion of the semiconductor light emitting device 1.

A passivation film 19 is provided as an insulating film between the sealing member 12 and the structural body that is made of the semiconductor layer 10, the n-side electrode 11n, the p-side electrode 11p, the adhesion layer 17, and the fluorescer layer 18. The passivation film 19 is formed of an insulating material, e.g., silicon oxide (SiO) or silicon nitride (SiN).

A hole 19n is made in the portion of the passivation film interposed between the n-side electrode 11n and the interconnect layer 13; and a portion 13n of the interconnect layer 13 is connected to the n-side electrode 11n via the hole 19n. A hole 19p is made in the portion of the passivation film 19 interposed between the p-side electrode 11p and the interconnect layer 13; and a portion 13p of the interconnect layer 13 is connected to the p-side electrode 11p via the hole 19p. The portion 13n and the portion 13p of the interconnect layer 13 are separated and insulated from each other. Further, one other portion 13s of the interconnect layer 13 covers the side surface of the semiconductor layer 10 continuing from the upper surface 10a of the semiconductor layer 10 and extends to be higher than the upper surface 10a of the semiconductor layer 10 to form a portion of the uppermost portion of the sealing member 12. The portion 13s functions as a light-shielding film. The portion 13s is formed integrally with the portion 13n and is formed to cover the entire circumference of the side surface of the semiconductor layer 10 in a ring configuration (an O-shape).

The configurations of the n-side pillar 14n and the p-side pillar 14p are, for example, quadrilateral columns that extend in the vertical direction. The n-side pillar 14n is disposed in the region directly under the portion 13n of the interconnect layer 13 and is connected to the portion 13n. The p-side pillar 14p is disposed in a region directly under the portion 13p of the interconnect layer 13 and is connected to the portion 13p.

The black resin portion 15 is included in the lower portion of the semiconductor light emitting device 1 and covers the side surface and lower surface of the semiconductor layer 10 with the interconnect layer 13 and the passivation film 19 interposed. Also, the black resin portion 15 covers the entire interconnect layer 13, the n-side pillar 14n side surface, and the p-side pillar 14p side surface. On the other hand, the lower surface of the n-side pillar 14n and the lower surface of the p-side pillar 14p are exposed at a lower surface 15a of the black resin portion 15.

As shown in FIG. 2A, a corner 12b of a protruding portion 12a of the sealing member 12, which protrudes to be higher than the upper surface 10a of the semiconductor layer 10, faces upward and toward the semiconductor layer 10 side and is rounded with a constant curvature radius r. In other words, the corner 12b is rounded. The curvature radius r is, for example, 1 μm (micron) or more. In an example, the thickness of the semiconductor layer 10 is 4 to 5 μm; and the protruding height of the protruding portion 12a with respect to the upper surface 10a of the semiconductor layer 10 is 3 to 5 μm. The protruding portion 12a of the sealing member 12 includes the metal portion of the sealing member 12, specifically, the portion 13s of the interconnect layer 13. Further, a side surface 12c of the protruding portion 12a that opposes the semiconductor layer 10 is tilted, with respect to a perpendicular surface, in a direction upward and away from the semiconductor layer 10.

As shown in FIGS. 1A and 1B and FIG. 2B, the end portion of the interconnect layer 13 extends onto the end portion of the n-side electrode 11n with the passivation film 19 interposed; and the end portion of the interconnect layer 13 overlaps the end portion of the n-side electrode 11n as viewed from below. In other words, an overlap amount L between the end portion of the interconnect layer 13 and the end portion of the n-side electrode 11n is within a positive range. Also, the region that divides the portion 13p and the portion 13n of the interconnect layer 13 is positioned in the region directly under the p-side electrode 11p. Therefore, the end portion of the portion 13p and the end portion of the portion 13n overlap the p-side electrode 11p with the passivation film 19 interposed as viewed from below. Accordingly, the entire semiconductor layer 10 or a greater part of the semiconductor layer 10 is covered with the interconnect layer 13, the n-side electrode 11n, and the p-side electrode 11p as viewed from below.

On the other hand, as shown in FIGS. 1A and 1B and FIG. 2A, the portion 13s of the interconnect layer 13 is disposed on the side surface of the semiconductor layer 10; and the entire semiconductor layer 10 or a greater part of the semiconductor layer 10 is covered with the portion 13s as viewed from the side. As described above, because the protruding portion 12a of the sealing member 12 includes the portion 13s of the interconnect layer 13 and because the protruding portion 12a protrudes to be higher than the upper surface 10a of the semiconductor layer 10, the portion 13s covers up to the upper end of the semiconductor layer 10 as viewed from the side. Thus, the entire semiconductor layer 10 or a greater part of the semiconductor layer 10 is covered with the n-side electrode 11n, the p-side electrode 11p, and the interconnect layer 13 as viewed from all side directions and from below.

A method for manufacturing the semiconductor light emitting device according to the embodiment will now be described.

FIGS. 3A and 3B to FIGS. 11A and 11B are cross-sectional views of processes, showing the method for manufacturing the semiconductor light emitting device according to the embodiment.

For convenience of description of the processes shown in FIG. 3A to FIG. 8B, the description of up and down in the text is the reverse of the notation of the drawings. In other words, in the text, the direction in which the n-side electrode 11n and the p-side electrode 11p are disposed as viewed from the semiconductor layer 10 is "up."

Figure 3A:
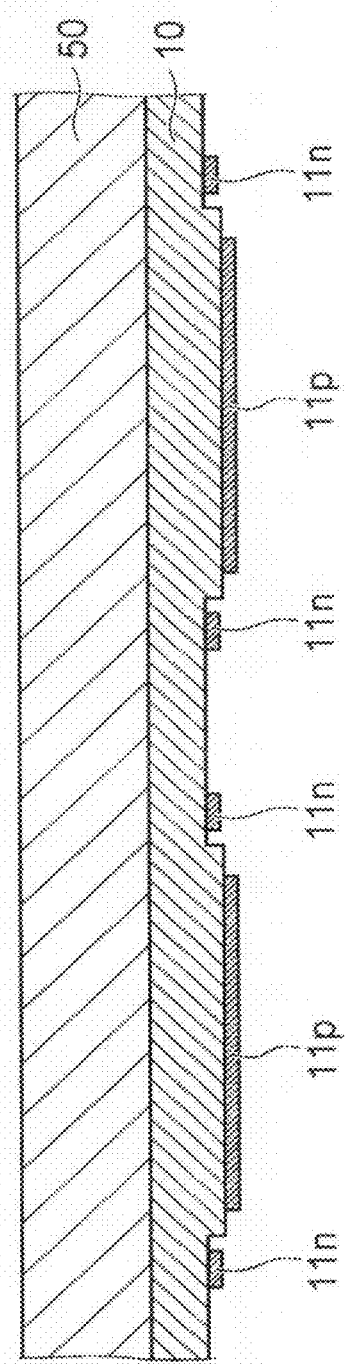

First, as shown in FIG. 3A, a substrate 50 for the crystal growth is prepared. The substrate 50 includes, for example, a silicon wafer. Then, the semiconductor layer 10 in which the n-type clad layer, the active layer, and the p-type clad layer are stacked in this order is formed on the entire surface of the upper surface of the substrate 50 by epitaxial growth of, for example, gallium nitride (GaN). The thickness of the semiconductor layer 10 is set to be, for example, 4 to 5 μm.

Then, for example, photolithography is performed to expose the n-type clad layer at a portion of the upper surface of the semiconductor layer 10 by selectively removing the p-type clad layer and the active layer. Continuing, the n-side electrode 11n is formed on the region of the upper surface of the semiconductor layer 10 where the n-type clad layer is exposed; and the p-side electrode 11p is formed on the region of the upper surface of the semiconductor layer 10 where the p-type clad layer remains.

Figure 3B:
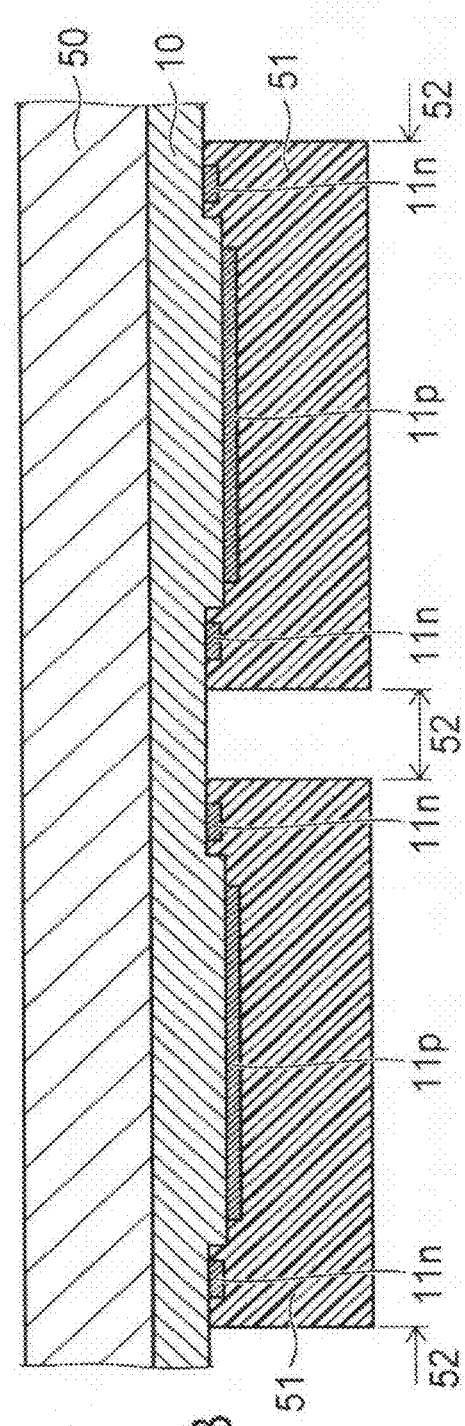

Continuing as shown in FIG. 3B, a resist pattern 51 is formed on the semiconductor layer 10. The resist pattern 51 is divided into multiple portions for each region where the semiconductor light emitting device 1 is to be formed such that the portions are arranged, for example, in a matrix configuration. A region 52 that is not covered with the portions of the resist pattern 51 has, for example, a lattice configuration and includes a region to be used as a dicing line in a subsequent process.

Figure 5A:
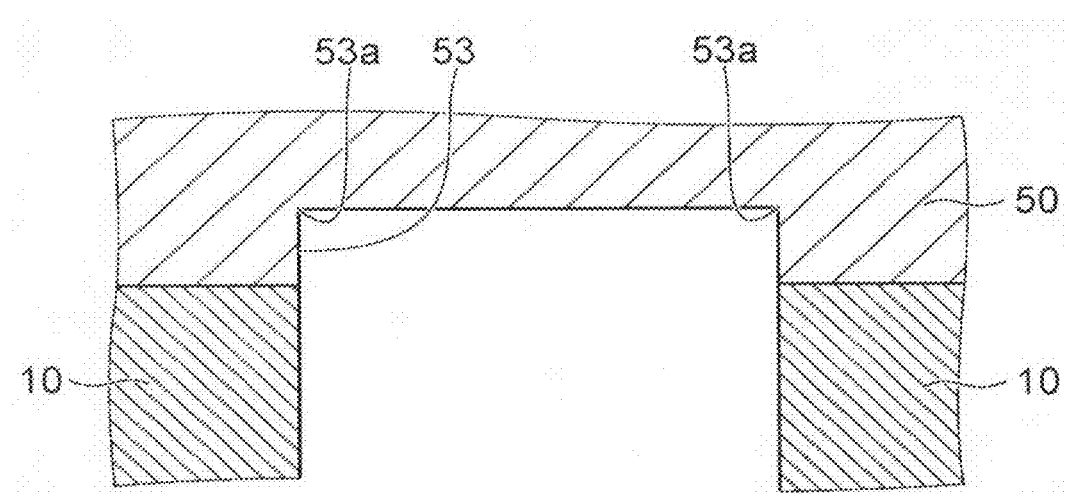

Then, as shown in FIG. 4A, the semiconductor layer 10 and the substrate 50 are selectively removed by performing dry etching such as RIE (reactive ion etching), etc., using the resist pattern 51 as a mask. Thereby, the semiconductor layer 10 is divided into multiple portions; and a trench 53 is made in the upper surface of the substrate 50. The trench 53 is made in the region 52; and the depth of the trench 53, i.e., the distance from the interface between the substrate 50 and the semiconductor layer 10 to the bottom surface of the trench 53, is, for example, 3 to 5 μm. Each of the portions of the semiconductor layer 10 is patterned into a rectangle as viewed from above; and the n-type clad layer is exposed at the four corners. Thus, the semiconductor layer 10 is patterned into a high mesa. At this time, as shown in FIG. 5A, corners 53a of the trench 53 are sharp. Also, the side surface of the trench 53 may be tilted such that the width of the trench 53 becomes narrower downward by adjusting the conditions of the dry etching.

Figure 5B:
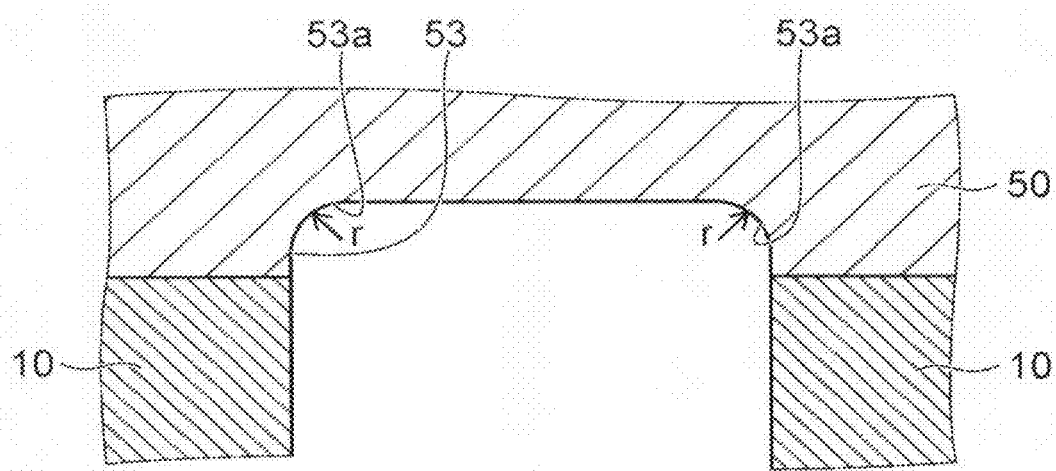

Continuing as shown in FIG. 4B, wet etching is performed using the resist pattern 51 as a mask. Thereby, as shown in FIG. 5B, the corners 53a of the trench 53 are rounded. At this time, for example, the curvature radii r of the corners 53a are set to be 1 μm or more.

Then, as shown in FIG. 6A, the resist pattern 51 (referring to FIG. 4B) is removed.

Continuing as shown in FIG. 6B, the passivation film 19 is formed on the entire surface by depositing an insulating material, e.g., silicon oxide or silicon nitride. The passivation film 19 also is formed on the inner surface of the trench 53 of the substrate 50.

Then, as shown in FIG. 7A, the passivation film 19 is patterned to make the hole 19n that communicates with the n-side electrode 11n and the hole 19p that communicates with the p-side electrode 11p. Then, a seed layer (not shown) of copper is formed on the entire surface. Continuing, a resist pattern 54 is formed in the region where the interconnect layer 13 is not to be formed in a subsequent process. The resist pattern 54 is disposed inside the outer edge of the n-side electrode 11n or inside the outer edge of the p-side electrode 11p as viewed from below. Then, copper is deposited by, for example, electroplating. Thereby, the interconnect layer 13 is formed in the region where the resist pattern 54 is not disposed. The portion 13n of the interconnect layer 13 is connected to the n-side electrode 11n via the hole 19n; and the portion 13p is connected to the p-side electrode 11p via the hole 19p. Also, the portion 13s is formed on the side surface of the semiconductor layer 10 to cover the corner 53a of the trench 53. By disposing the resist pattern 54 inside the outer edge of the n-side electrode 11n or inside the outer edge of the p-side electrode 11p as viewed from below, the end portion of the interconnect layer 13 overlaps the end portion of the n-side electrode 11n and the end portion of the p-side electrode 11p. Subsequently, the resist pattern 54 is removed.

Continuing as shown in FIG. 7B, the n-side pillar 14n and the p-side pillar 14p are formed by selectively depositing, for example, copper. The n-side pillar 14n is connected to the portion 13n of the interconnect layer 13; and the p-side pillar 14p is connected to the portion 13p of the interconnect layer 13.

Then, as shown in FIG. 8A, the seed layer is removed by performing etching of the entire surface. Thereby, the interconnect layer 13 is divided into multiple portions; and the portion 13n and the portion 13p are insulated from each other.

Continuing as shown in FIG. 8B, a black resin is coated onto the entire surface of the substrate 50 to cover the n-side pillar 14n and the p-side pillar 14p. Thereby, the black resin portion 15 is formed. The sealing member 12 is formed of the interconnect layer 13, the n-side pillar 14n, the p-side pillar 14p, and the black resin portion 15.

Then, as shown in FIG. 9A, the substrate 50 (referring to FIG. 8B) is removed. Thereby, the surface of the semiconductor layer 10 that contacted the substrate 50 is exposed. In the description hereinbelow, the notation of up and down is reversed to match the drawings.

Continuing as shown in FIG. 9B, an unevenness is formed in the exposed surface of the semiconductor layer 10, i.e., the upper surface 10a.

Then, as shown in FIG. 10A, the adhesion layer 17 is formed by depositing silicon oxide on the entire surface on the upper surface of the sealing member 12 that opposed the substrate 50 and on the upper surface 10a of the semiconductor layer 10.

Continuing as shown in FIG. 10B, the fluorescer layer 18 is formed on the adhesion layer 17. At this time, the fluorescer layer 18 is heated to, for example, about 170° C.

Then, as shown in FIG. 11A, the lower surface of the n-side pillar 14n and the lower surface of the p-side pillar 14p are exposed by polishing the lower surface of the black resin portion 15.

Continuing as shown in FIG. 11B, dicing is performed along the dicing line set inside the region 52. At this time, a dicing blade 55 passes through the trench 53. Thereby, the fluorescer layer 18 and the black resin portion 15 are singulated for each semiconductor layer 10; and multiple semiconductor light emitting devices 1 (referring to FIGS. 1A and 1B) are manufactured collectively.

Effects of the embodiment will now be described.

Figure 12:
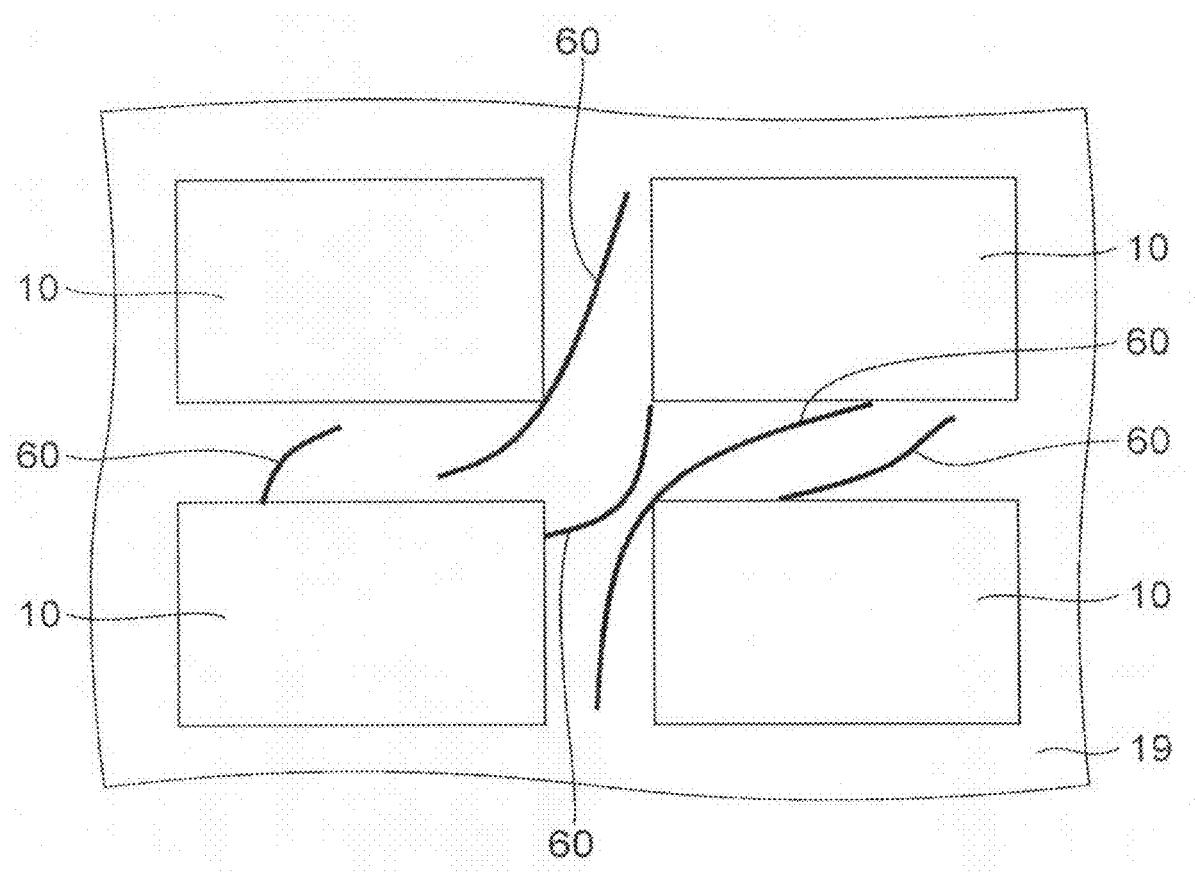
FIG. 12 is a plan view showing a method for manufacturing a semiconductor light emitting device according to a comparative example.

FIG. 12 is a plan view showing a method for manufacturing a semiconductor light emitting device according to a comparative example.

The process shown in FIG. 12 corresponds to the process shown in FIG. 10B. Namely, FIG. 12 shows the state directly after the fluorescer layer 18 is formed. The fluorescer layer 18 is not shown in FIG. 12.

The processes shown in FIG. 4B and FIG. 5B are omitted from the method for manufacturing the semiconductor light emitting device according to the comparative example. In other words, in the comparative example, the corners 53a of the trench 53 of the substrate 50 are not rounded; and accordingly, the corners 12b of the protruding portion 12a of the sealing member 12 are not rounded.

In the comparative example as shown in FIG. 12, when the substrate 50 (referring to FIG. 8B) is removed and the fluorescer layer 18 (referring to FIG. 10B) is formed on the semiconductor layer 10 and the sealing member 12, there are cases where cracks 60 occur in the passivation film 19 on the sealing member 12 due to the heating for forming the fluorescer layer 18. The cracks 60 occur from starting points mainly in the vicinity of the corners 12b of the protruding portion 12a and the corners of the semiconductor layer 10. In the case where the cracks 60 occur in the passivation film 19, the environment-shielding properties and insulative properties of the passivation film 19 decrease; and the reliability of the semiconductor light emitting device degrades.

Conversely, in the embodiment, the corners 12b of the protruding portion 12a are rounded as shown in FIG. 2A by rounding the corners 53a of the trench 53 in the processes shown in FIG. 4B and FIG. 5B. Thereby, the stress applied to the passivation film 19 from the sealing member 12 does not concentrate easily at the corners 12b; and the occurrence of the cracks 60 having the corners 12b as starting points can be suppressed. As a result, the reliability of the semiconductor light emitting device 1 can be improved.

Test examples that illustrate the effects of the embodiment will now be described.

In the test examples, the semiconductor light emitting device 1 was modeled to simulate the internal stress distribution of the passivation film 19.

First, a first simulation result will be described.

Figure 13A:
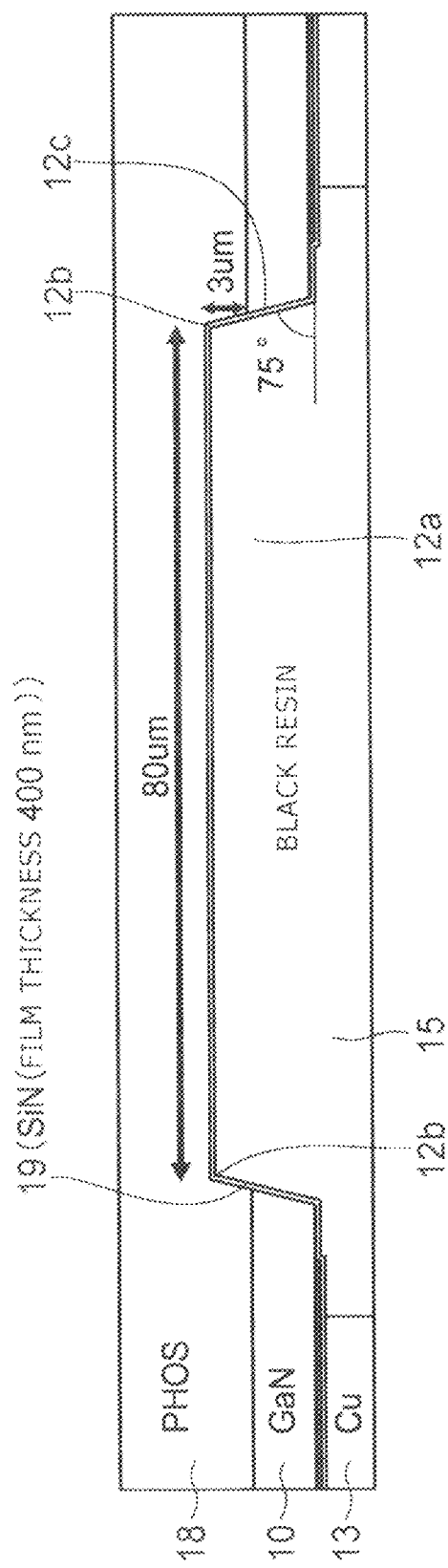
FIG. 13A shows a model of a semiconductor light emitting device assumed in a first simulation.
Figure 13B:
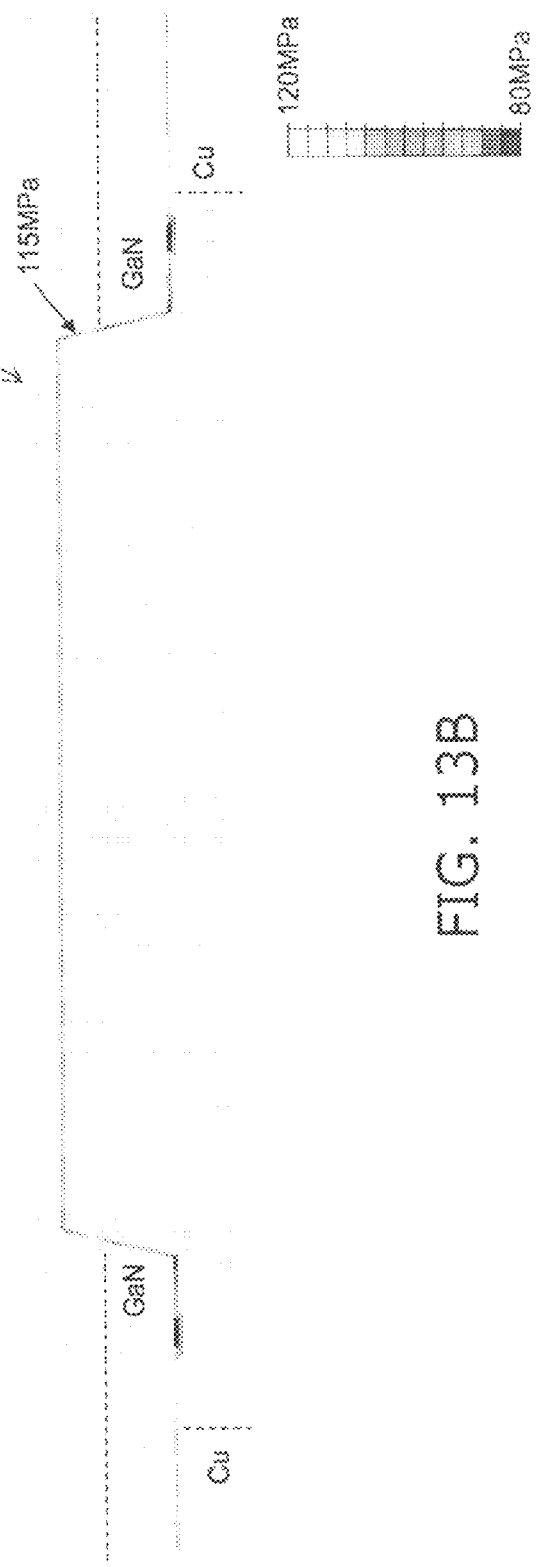
FIG. 13B shows a simulation result using the model of FIG. 13A.

FIG. 13A shows the model of the semiconductor light emitting device assumed in the simulation; and FIG. 13B shows the simulation result using the model of FIG. 13A.

Figure 14A:
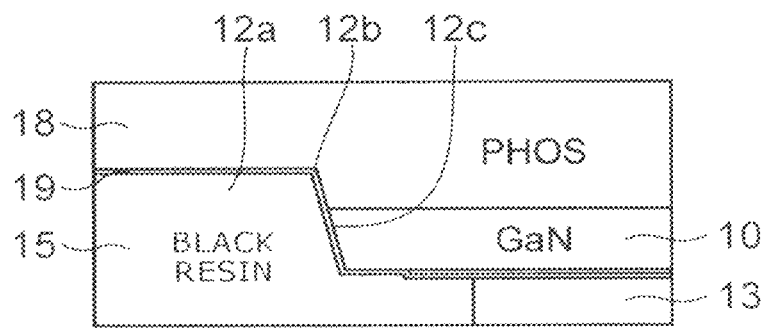
FIG. 14A is a partially-enlarged view of FIG. 13A.
Figure 14B:
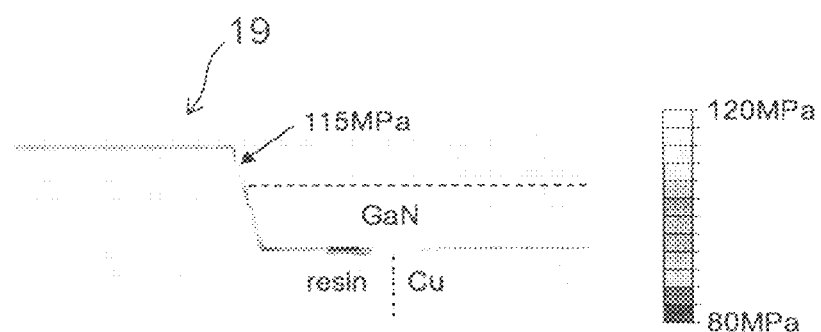
FIG. 14B is a partially-enlarged view of FIG. 13B.

FIG. 14A is a partially-enlarged view of FIG. 13A; and FIG. 14B is a partially-enlarged view of FIG. 13B.

As shown in FIG. 13A and FIG. 14A, the materials and dimensions of each component of the simulation were assumed to be as follows. Namely, the semiconductor layer 10 was formed of gallium nitride (GaN); the resin portion (the black resin portion 15) of the sealing member 12 was formed of a black resin; the metal portion (the interconnect layer 13, the n-side pillar 14n, and the p-side pillar 14p) of the sealing member 12 was formed of copper (Cu); and the passivation film 19 was formed of silicon nitride (SiN). Further, the width of the protruding portion 12a of the sealing member 12 was 80 μm; the height of the protruding portion 12a using the upper surface 10a of the semiconductor layer 10 as a reference was 3 μm; the tilt angle of the protruding portion 12a side surface 12c using the upper surface 10a as a reference was 75 degrees; and the thickness of the passivation film 19 was 400 nm. The corner 12b of the protruding portion 12a was formed of a black resin. The corner 12b was not rounded. In other words, the curvature radius r of the corner 12b was 0.

In such a case, as shown in FIG. 13B and FIG. 14B, the stress distribution of the passivation film 19 had peaks at the vicinity of the corner 12b of the protruding portion 12a and at the vicinity of the boundary between the resin portion and the metal portion of the sealing member 12; and the maximum stress at the corner 12b vicinity was 115 MPa.

A second simulation result will now be described.

Figure 15A:
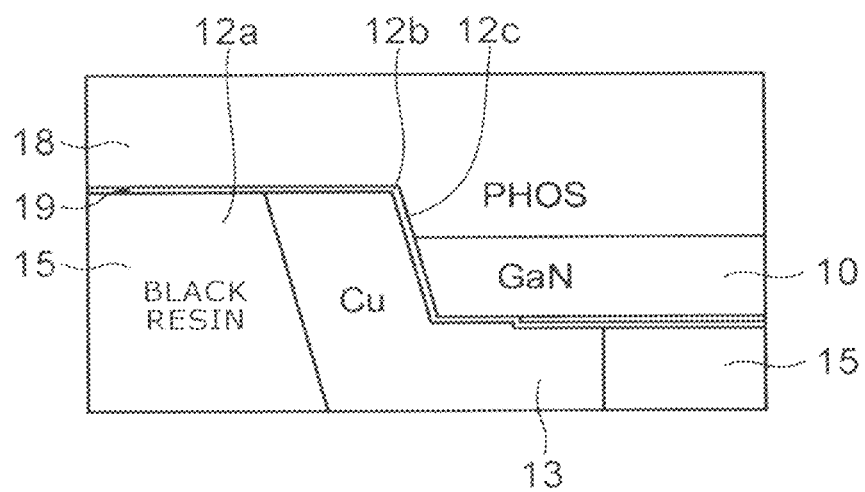
FIG. 15A shows a model of a semiconductor light emitting device assumed in a second simulation.
Figure 15B:
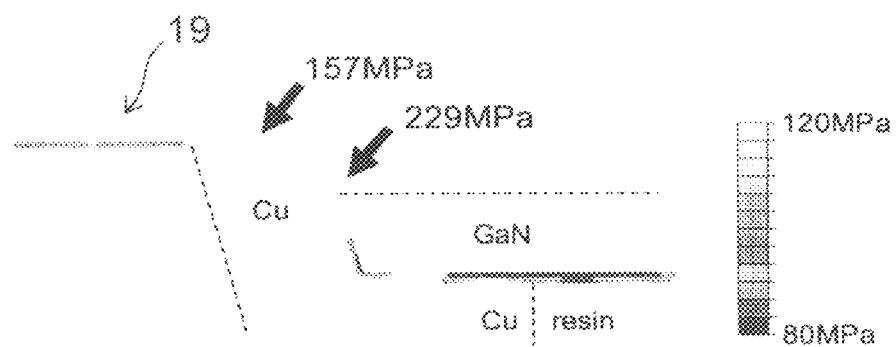
FIG. 15B shows a simulation result using the model of FIG. 15A.

FIG. 15A shows a model of the semiconductor light emitting device assumed in the simulation; and FIG. 15B shows the simulation result using the model of FIG. 15A.

As shown in FIG. 15A, the model assumed in the simulation differs from the first simulation described above in that the corner 12b of the protruding portion 12a was formed of copper. According to the simulation, it is possible to substantially simulate the case where a light-shielding film, i.e., the portion 13s of the interconnect layer 13, is disposed at the corner 12b of the protruding portion 12a.

In the simulation as shown in FIG. 15B, a high stress occurred at the portion of the passivation film 19 disposed at the corner 12b vicinity; and the maximum stress was 229 MPa.

Thus, the stress distribution of the passivation film 19 was concentrated at the corner 12b vicinity in the case where the corner 12b was not rounded. Therefore, it is considered that the cracks 60 occur in the passivation film 19 with the corner 12b vicinity as a starting point.

Further, in the embodiment, the end portion of the interconnect layer 13 extends onto the end portion of the n-side electrode 11*n* with the passivation film 19 interposed. Thereby, in the region where the end portion of the interconnect layer 13 overlaps the end portion of the n-side electrode 11*n*, the light that is emitted from the semiconductor layer 10 and the light that is emitted from the fluorescer layer 18 are reflected; and the light that is incident on the black resin portion 15 can be suppressed. As a result, degradation of the black resin portion 15 due to the irradiation of the light can be suppressed; and the reliability of the semiconductor light emitting device 1 can be increased. Also, by setting the interconnect layer 13, the n-side electrode 11*n*, and the p-side electrode 11*p* to overlap, the light that is emitted from the semiconductor layer 10 and the fluorescer layer 18 toward the black resin portion 15 is reflected and extracted outside the semiconductor light emitting device 1. Thereby, the output of the light can be increased because the light that originally would be absorbed by the black resin portion 15 can be utilized effectively.

Further, in the semiconductor light emitting device 1 according to the embodiment, the portion 13*s* is formed integrally with the portion 13*n*. By forming the portion 13*s* integrally with one selected from the portions 13*n* and 13*p*, the portion 13*s* can be formed to cover the entire circumference of the side surface of the semiconductor layer 10 in a ring configuration (an O-shape). Thereby, gaps that leak the light emitted from the semiconductor layer 10 are favorably reduced.

Also, because the portion 13*s* is formed integrally with the portion 13*n*, the portion 13*s* that is used as the light-shielding film is connected to the outside via the portion 13*n* and the n-side pillar 14*n*. Thereby, the heat dissipation path of (portion 13*s*→portion 13*n*→n-side pillar 14*n*) is formed; and the heat dissipation of the semiconductor layer 10 improves.

The portion 13*n*, the portion 13*p*, and the portion 13*s* of the interconnect layer 13 may be separated from each other. In such a case as well, the gaps are favorably reduced because the portion 13*s* can cover the entire circumference of the side surface of the semiconductor layer 10 in the ring configuration (the O-shape). Part of the portion 13*s* may be formed integrally with the portion 13*n*; and the remainder of the portion 13*s* may be formed integrally with the portion 13*p* and insulated from the part of the portion 13*s*.

First Modification of the First Embodiment

A first modification of the first embodiment will now be described.

Figure 16:
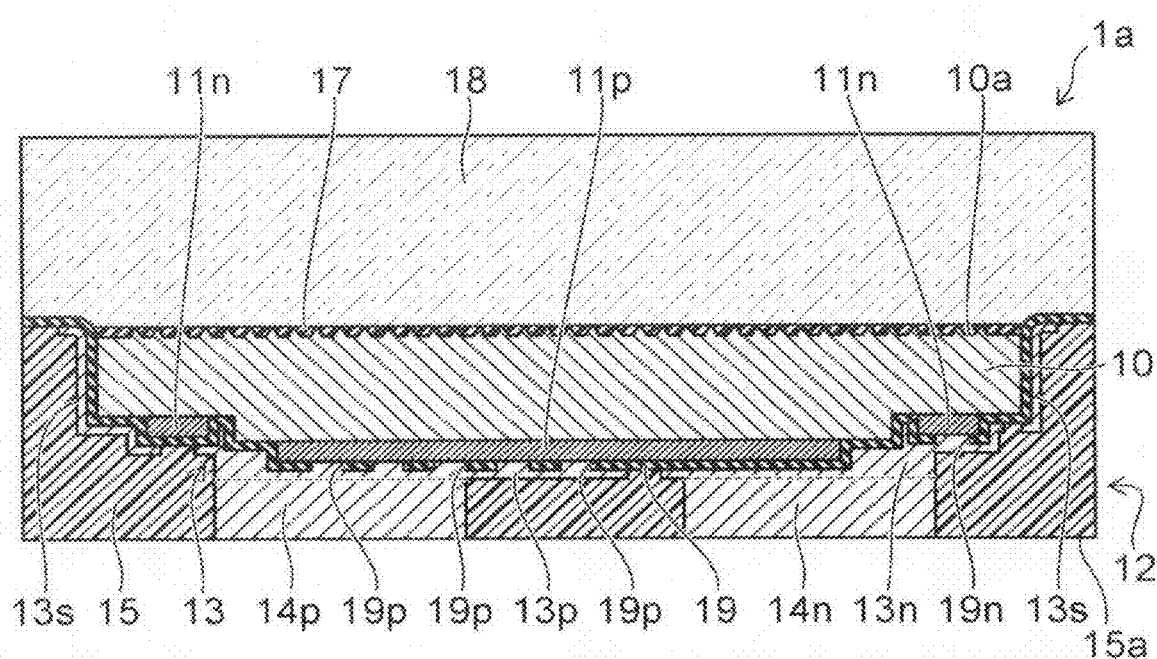
FIG. 16 is a cross-sectional view showing a semiconductor light emitting device according to a first modification of the first embodiment.

FIG. 16 is a cross-sectional view showing a semiconductor light emitting device according to the modification.

In the semiconductor light emitting device 1*a* according to the modification as shown in FIG. 16, the portion 13*s* of the interconnect layer 13 is separated from the portion 13*n*. Thereby, the portion 13*n* that functions as the light-shielding film is insulated from both the n-side electrode 11*n* and the p-side electrode 11*p*. Otherwise, the configuration, the manufacturing method, and the effects of the modification are similar to those of the first embodiment described above.

Second Modification of the First Embodiment

A second modification of the first embodiment will now be described.

Figure 17A:
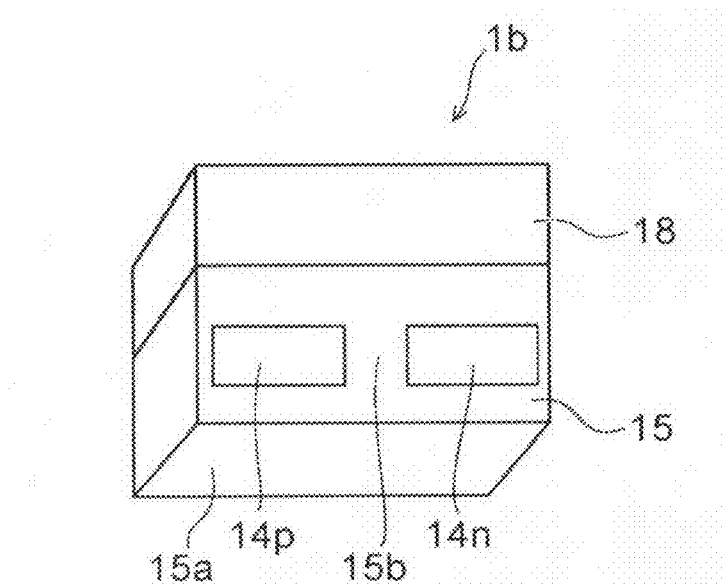
FIG. 17A is a perspective view showing a semiconductor light emitting device according to a second modification of the first embodiment.
Figure 17B:
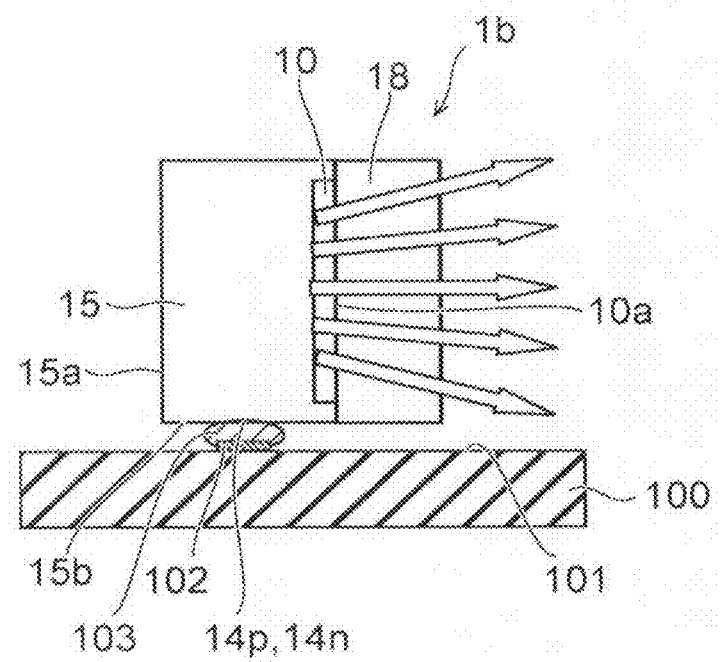
FIG. 17B is a side view showing a state in which the semiconductor light emitting device is mounted to a mounting substrate.

FIG. 17A is a perspective view showing a semiconductor light emitting device according to the modification; and FIG. 17B is a side view showing the state in which the semiconductor light emitting device is mounted to a mounting substrate.

In the semiconductor light emitting device 1*b* according to the modification as shown in FIG. 17A, the n-side pillar 14*n* and the p-side pillar 14*p* are exposed not at the lower surface 15*a* of the black resin portion 15 but at a side surface 15*b* of the black resin portion 15. The side surface 15*b* of the black resin portion 15 is a surface included in the same plane as the side surface of the fluorescer layer 18.

When the semiconductor light emitting device 1*b* is mounted to a mounting substrate 100 as shown in FIG. 17B, the n-side pillar 14*n* and the p-side pillar 14*p* that are exposed at the side surface 15*b* of the black resin portion 15 of the semiconductor light emitting device 1*b* are connected by solder 103 to two electrode pads 102 provided in a mounting surface 101 of the mounting substrate 100. Thereby, the light emitting surface of the semiconductor light emitting device 1*b*, i.e., the upper surface of the fluorescer layer 18, is substantially perpendicular to the mounting surface 101 of the mounting substrate 100. As a result, the semiconductor light emitting device 1*b* can emit light mainly in a direction parallel to the mounting surface 101. Otherwise, the configuration, the manufacturing method, and the effects of the modification are similar to those of the first embodiment described above.

Second Embodiment

A second embodiment will now be described.

Figure 18:
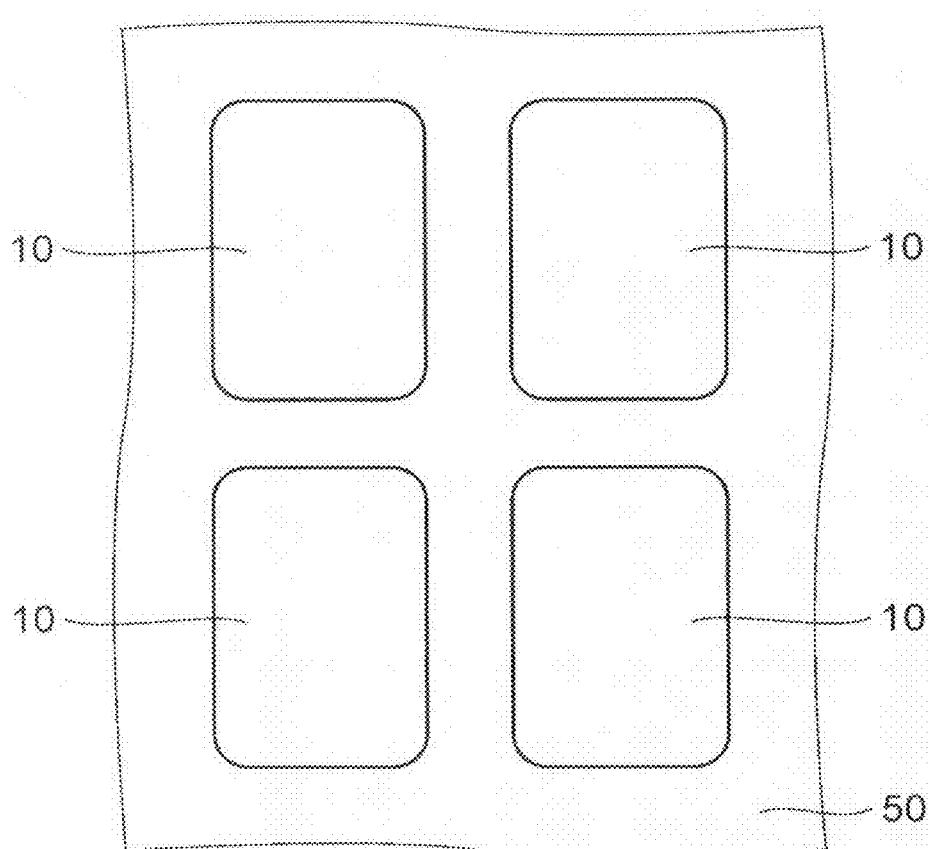
FIG. 18 is a process plan view showing a method for manufacturing a semiconductor light emitting device according to a second embodiment.

FIG. 18 is a process plan view showing a method for manufacturing a semiconductor light emitting device according to the embodiment.

The process shown in FIG. 18 corresponds to the process shown in FIG. 4A. For convenience of illustration in FIG. 18, the components other than the substrate 50 and the semiconductor layer 10 are not shown.

In the embodiment as shown in FIG. 18, the corners of the portions are rounded when the semiconductor layer 10 is divided by patterning. In other words, the configuration of the semiconductor layer 10 included in one semiconductor light emitting device is a rectangle that has rounded corners as viewed from above. Thereby, the concentration of the stress in the passivation film due to the corners of the semiconductor layer 10 can be suppressed; and the occurrence of cracks in the passivation film having the vicinity of the corners of the semiconductor layer 10 as starting points can be suppressed.

Otherwise, the configuration, the manufacturing method, and the effects of the embodiment are similar to those of the first embodiment described above.

Similarly to the embodiment, the corners of the semiconductor layer 10 may be rounded in the first embodiment described above as well. Thereby, the occurrence of the cracks of the passivation film 19 can be more effectively suppressed. As a result, the reliability of the semiconductor light emitting device can be improved even more.

Third Embodiment

A third embodiment will now be described.

Figure 19A:
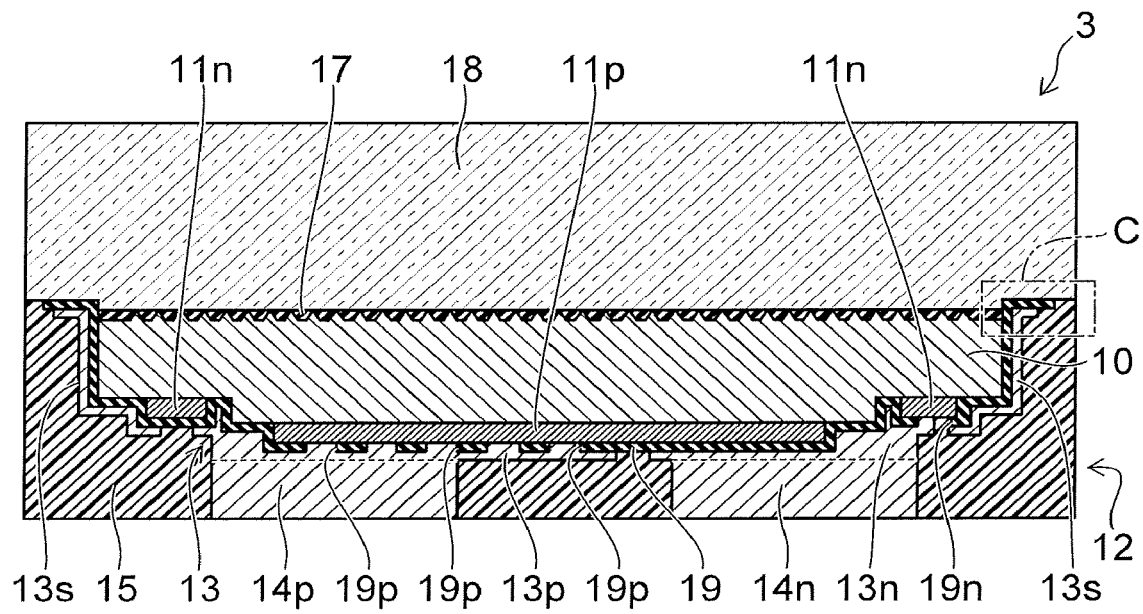
FIG. 19A is a cross-sectional view showing a semiconductor light emitting device according to a third embodiment.
Figure 19B:
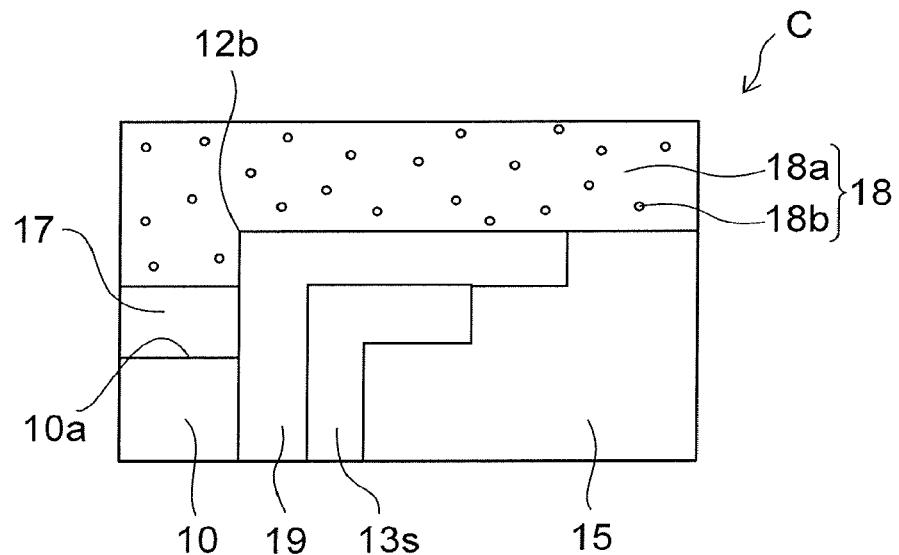
FIG. 19B is a partially-enlarged cross-sectional view showing region C of FIG. 19A.

FIG. 19A is a cross-sectional view showing a semiconductor light emitting device according to the embodiment; and FIG. 19B is a partially-enlarged cross-sectional view showing region C of FIG. 19A.

At the outer circumferential portion of the chip of the semiconductor light emitting device 3 according to the embodiment as shown in FIGS. 19A and 19B, the passivation film 19 is not provided; and the black resin portion 15 contacts the fluorescer layer 18. On the other hand, the semiconductor light emitting device 3 differs from the semiconductor light emitting device 1 in that the corner 12b of the protruding portion 12a of the sealing member 12 is not rounded. Also, the side surface 12c of the protruding portion 12a of the sealing member 12 opposing the semiconductor layer 10 is perpendicular to the upper surface 10a of the semiconductor layer 10.

A method for manufacturing the semiconductor light emitting device according to the embodiment will now be described.

Figure 20:
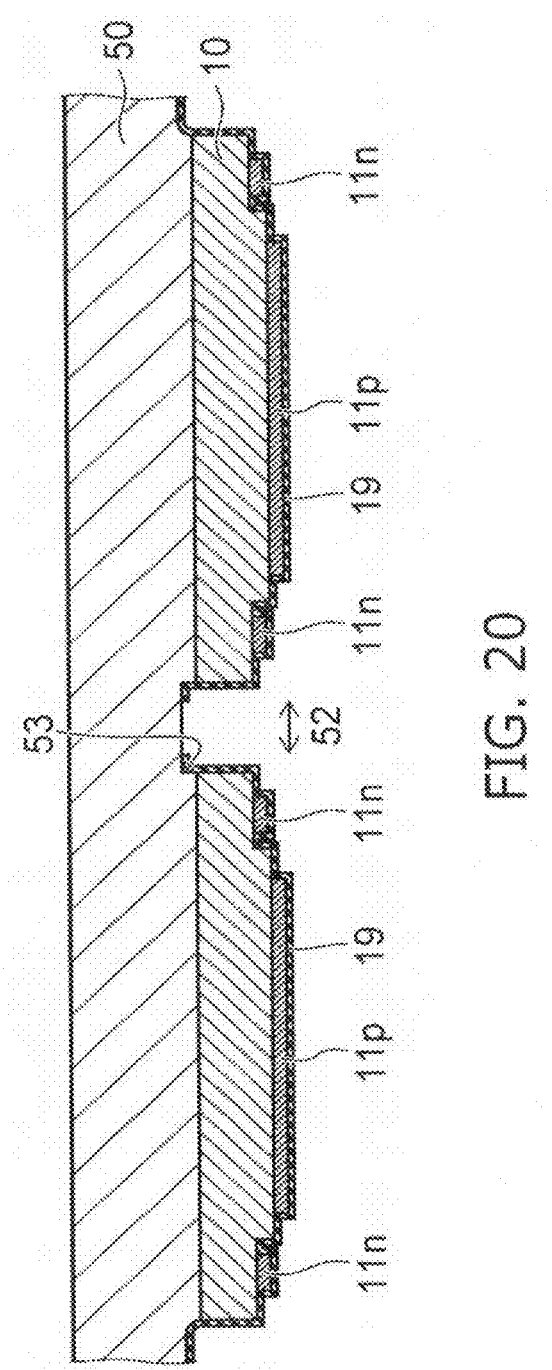
FIG. 20 is a cross-sectional view of a process, showing a method for manufacturing the semiconductor light emitting device according to the third embodiment.

FIG. 20 is a cross-sectional view of a process, showing the method for manufacturing the semiconductor light emitting device according to the embodiment.

First, the processes shown in FIG. 3A, FIG. 3B, and FIG. 4A are implemented. However, the wet etching process shown in FIG. 4B is omitted. Then, the n-side electrode 11n, the p-side electrode 11p, and the passivation film 19 are formed by implementing the processes shown in FIGS. 6A and 6B.

Continuing as shown in FIG. 20, for example, RIE is performed to remove the passivation film 19 from the region 52 where the dicing line is to be set. Thereby, the passivation film 19 is divided for every semiconductor layer 10.

The subsequent processes are similar to those of the first embodiment. In other words, the processes shown in FIG. 7A to FIG. 11B are implemented.

Effects of the embodiment will now be described.

In the embodiment, the passivation film 19 is divided for every semiconductor layer 10 in the process shown in FIG. 20. Thereby, the internal stress of the passivation film 19 can be relaxed; and the warp of the silicon wafer used to form the substrate 50 for crystal growth or the resin wafer used to form the sealing member 12 can be reduced. In other words, the thermal stress between the passivation film 19 and the substrate 50 and the thermal stress between the passivation film 19 and the sealing member 12 can be reduced from an amount corresponding to the wafer size to an amount corresponding to the chip size; and the warp that is due to the thermal stress can be reduced. Thereby, not only are the manufacturing processes easy, but also the stress remaining in the semiconductor light emitting device 3 after completion decreases; and the occurrence of the cracks 60 (referring to FIG. 12) can be suppressed.

Otherwise, the configuration, the manufacturing method, and the effects of the embodiment are similar to those of the first embodiment described above.

The embodiment may be combined with other embodiments and modifications of other embodiments. For example, as in the first embodiment described above, the corner 12b of the protruding portion 12a of the sealing member 12 (referring to FIG. 2A) may be rounded. Further, the side surface 12c of the protruding portion 12a may be tilted with respect to the perpendicular surface.

Fourth Embodiment

A fourth embodiment will now be described.

FIG. 21A is a cross-sectional view showing a semiconductor light emitting device according to the embodiment; and FIG. 21B is a bottom view of FIG. 21A.

Figure 22A:
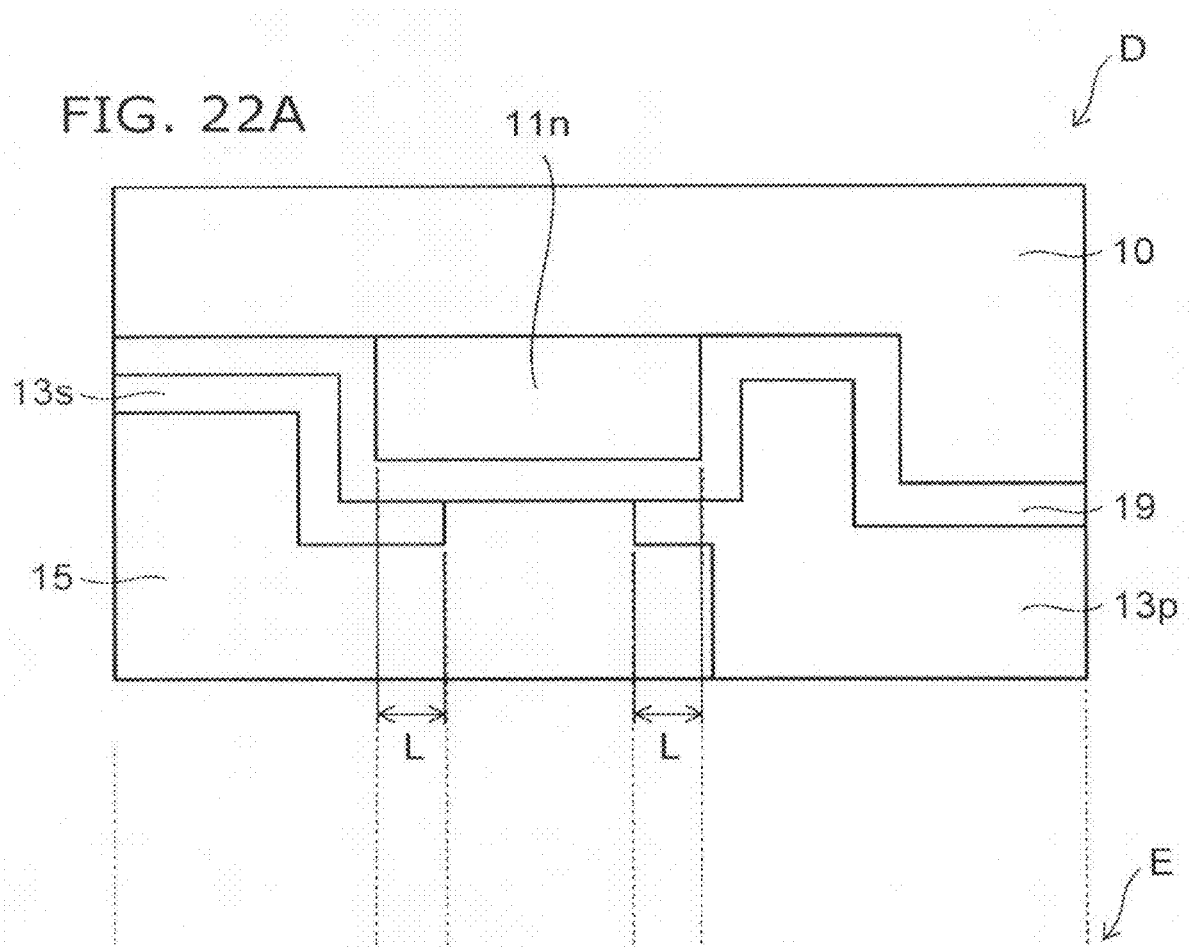
FIG. 22A is a partially-enlarged cross-sectional view showing region D of FIG. 21A.
Figure 22B:
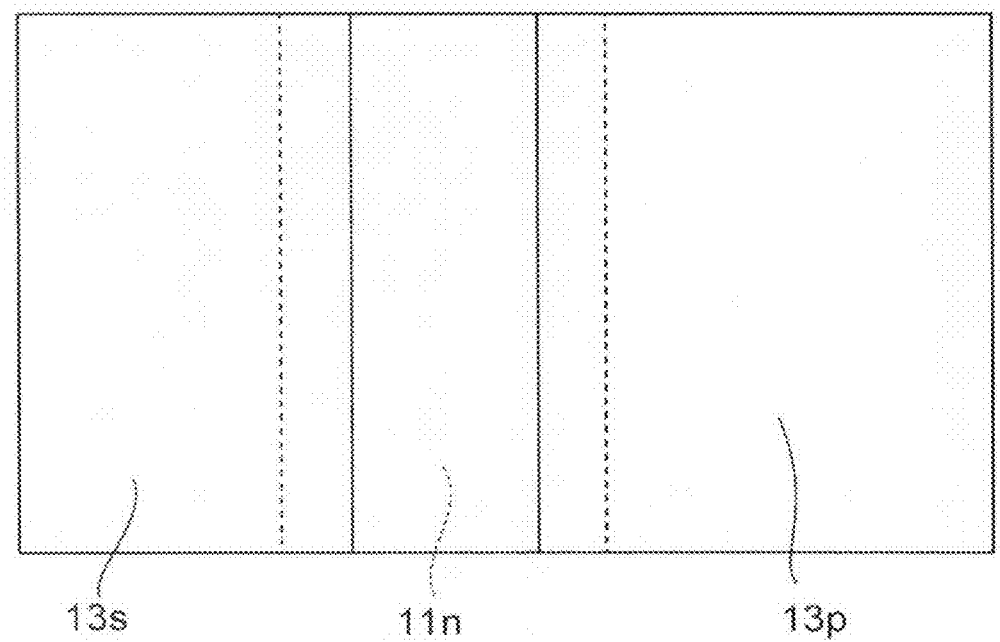
FIG. 22B is a partially-enlarged plan view showing region E of FIG. 21B.

FIG. 22A is a partially-enlarged cross-sectional view showing region D of FIG. 21A; and FIG. 22B is a partially-enlarged plan view showing region E of FIG. 21B.

In FIG. 21B and FIG. 22B, only the semiconductor layer 10, the n-side electrode 11n, the p-side electrode 11p, and the interconnect layer 13 are shown for easier viewing of the drawing. Also, the edge lines that illustrate the configurations of these members are not shown.

In the semiconductor light emitting device 4 according to the embodiment as shown in FIGS. 21A and 21B and FIGS. 22A and 22B, similarly to the semiconductor light emitting device 1 (referring to FIGS. 1A and 1B) according to the first embodiment described above, the end portion of the interconnect layer 13 extends to partially overlap the n-side electrode 11n and the p-side electrode 11p with the passivation film 19 interposed. Therefore, substantially the entire semiconductor layer 10 is covered with the n-side electrode 11n, the p-side electrode 11p, and the interconnect layer 13 as viewed from below and from the side.

On the other hand, the semiconductor light emitting device 4 differs from the semiconductor light emitting device 1 in that the corner 12b of the protruding portion 12a of the sealing member 12 (referring to FIG. 2A) is not rounded. Such a configuration is formed by omitting the wet etching process shown in FIG. 4B. Also, the portion 13n, the portion 13p, and the portion 13s of the interconnect layer 13 are separated from each other in the semiconductor light emitting device 4.

In the embodiment as well, similarly to the first embodiment described above, the light emitted from the semiconductor layer 10 and the fluorescer layer 18 that is incident on the black resin portion 15 can be suppressed; and the degradation of the black resin portion 15 can be suppressed. Also, because the light can be extracted efficiently, the output of the light can be increased.

In the semiconductor light emitting device 4 according to the embodiment, the portion 13n, the portion 13p, and the portion 13s of the interconnect layer 13 are separated from each other. In such a case as well, similarly to the first embodiment, the portion 13s can be formed in a ring configuration (an O-shape) to continuously cover the entire circumference of the side surface of the semiconductor layer 10. Thereby, the gaps that leak the light emitted from the semiconductor layer 10 can be reduced effectively. The portion 13s may be formed integrally with the portion 13p or the portion 13n. By such a method as well, the portion 13s can be formed in a ring configuration. Further, part of the portion 13s may be formed integrally with the portion 13n; and the remainder of the portion 13s may be formed integrally with the portion 13p and insulated from the part of the portion 13s.

Further, in the embodiment, the manufacturing cost can be reduced because the wet etching process shown in FIG. 4B is omitted. Otherwise, the configuration and the manufacturing method of the embodiment are similar to those of the first embodiment described above.

Although an example is illustrated in the embodiments described above in which the black resin portion 15 is formed of a black resin, the black resin portion 15 is not limited thereto and may be formed of resins of other colors. For example, a white resin may be used.

According to the embodiments described above, a semiconductor light emitting device and a method for manufacturing the semiconductor light emitting device having high reliability can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. A semiconductor light emitting device, comprising:
   a semiconductor layer that includes a p-type layer and an n-type layer;
   a sealing member configured to cover a lower surface and a side surface of the semiconductor layer;
   a fluorescer layer provided above the semiconductor layer and the sealing member, the fluorescer layer including a main material made of a resin, and
   fluorescer particles dispersed in the main material; and
   a passivation film having a first portion and a second portion, the first portion being provided on the lower surface and the side surface of the semiconductor layer, and between the semiconductor layer and the sealing member, the second portion being higher than the entire semiconductor layer, being provided between the sealing member and the fluorescer layer, and extending to get away from the semiconductor layer along a surface of the sealing member facing the fluorescer layer, and
   the passivation film free from being provided at an outer circumferential portion of the semiconductor light emitting device,
   wherein the fluorescer layer includes a first region facing the semiconductor layer and a second region facing a protruding portion of the sealing member, the first region protrudes to be lower than the second region,
   wherein the second portion of the passivation film is in direct contact with a side surface of the first region of the fluorescer layer and in direct contact with a lower surface of the second region of the fluorescer layer, and
   wherein the second portion of the passivation film has a top major surface and a bottom major surface, the bottom major surface in the second portion of the passivation film is higher than the semiconductor layer, is higher than a lowest portion of the first region of the fluorescer layer, and is provided between the sealing member and the side surface of the first region and the lower surface of the second region of the fluorescer layer.

2. The device according to claim 1, further comprising an adhesive layer provided between the semiconductor layer and the fluorescer layer.

3. The device according to claim 1, wherein the sealing member is configured to protrude to be higher than an upper surface of the semiconductor layer at a side of the semiconductor layer.

4. The device according to claim 1, further comprising an electrode connected to the semiconductor layer,
   the sealing member being configured to cover a lower surface and a side surface of a structural body made of the semiconductor layer and the electrode,
   the sealing member including:
      a metal portion; and
      a resin portion, and
   an end portion of the metal portion extending onto an end portion of the electrode with the passivation film interposed.

* * * * *